US 8,297,907 B2

Oct. 30, 2012

(12) United States Patent
Yazawa et al.

(54) INDUSTRIAL ROBOT

(75) Inventors: Takayuki Yazawa, Nagano (JP); Junnosuke Koyama, Nagano (JP)

(73) Assignee: Nidec Sankyo Corporation (JP)

( * ) Notice: Subject to any disclaimer, the term of this patent is extended or adjusted under 35 U.S.C. 154(b) by 829 days.

(21) Appl. No.: 12/240,539

(22) Filed: Sep. 29, 2008

(65) Prior Publication Data

US 2009/0084215 A1 Apr. 2, 2009

(30) Foreign Application Priority Data

Sep. 28, 2007 (JP) .................. 2007-255108

(51) Int. Cl.
*B25J 15/00* (2006.01)

(52) U.S. Cl. ............... 414/744.5; 901/15; 901/31

(58) Field of Classification Search ........... 414/744.1, 414/744.5; 901/15, 31
See application file for complete search history.

(56) References Cited

U.S. PATENT DOCUMENTS 5,702,228 A * 12/1997 Tamai et al. ............ 414/744.5
6,322,312 B1 * 11/2001 Sundar .................... 414/744.5
6,428,266 B1 * 8/2002 Solomon et al. ......... 414/744.4
6,893,204 B1 * 5/2005 Suzuki et al. ........... 414/744.5

FOREIGN PATENT DOCUMENTS

JP     2000-308988     11/2000

* cited by examiner

*Primary Examiner* — Donald Underwood
(74) *Attorney, Agent, or Firm* — Cantor Colburn LLP

(57) ABSTRACT

An industrial robot for conveying a conveying object may include a hand having a mounting part, an articulated arm part having at least a hand holding arm which is extended and folded when the conveying object is conveyed, a main body part which turnably holds the articulated arm part, and a cam member which is provided in the hand holding arm and which is formed with a cam face with which the holding part is abutted and which is relatively turned with respect to the hand around a turning center of the hand with an extending and folding operation of the articulated arm part. The cam face is formed so that the holding part is retreated from the conveying object before the conveying object is conveyed and, when the conveying object is conveyed, the holding part is moved in a direction to hold the conveying object.

13 Claims, 12 Drawing Sheets

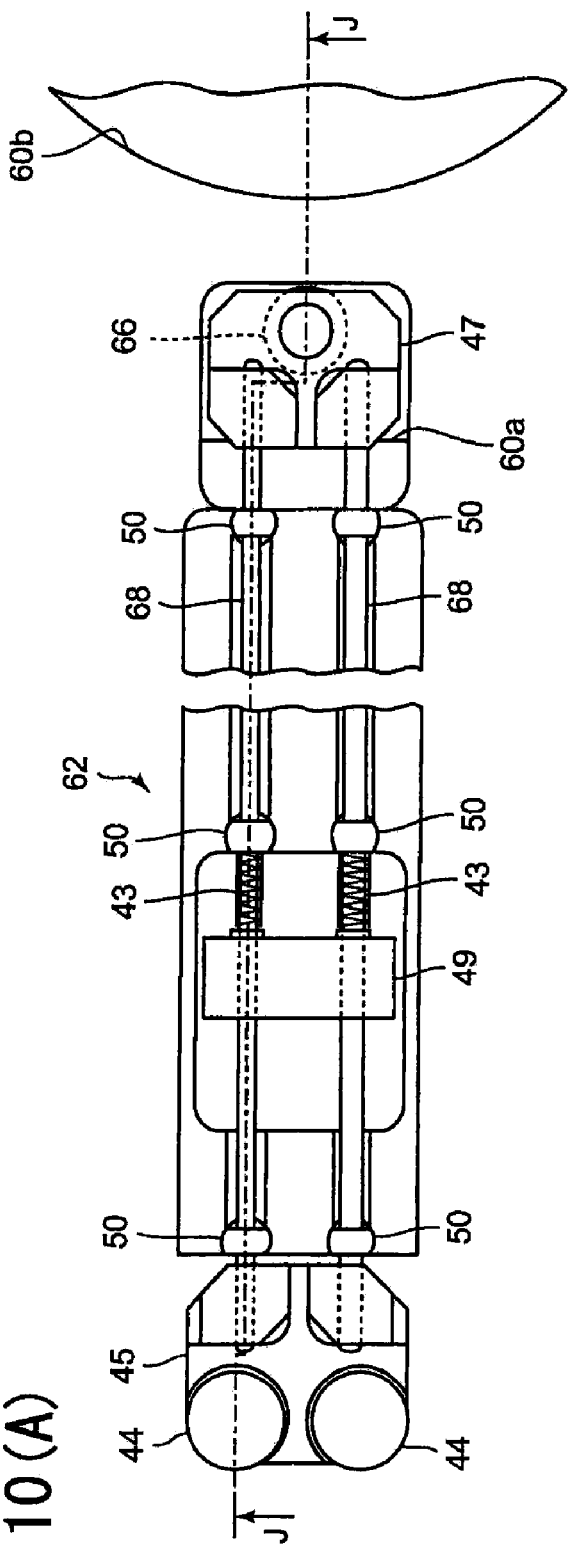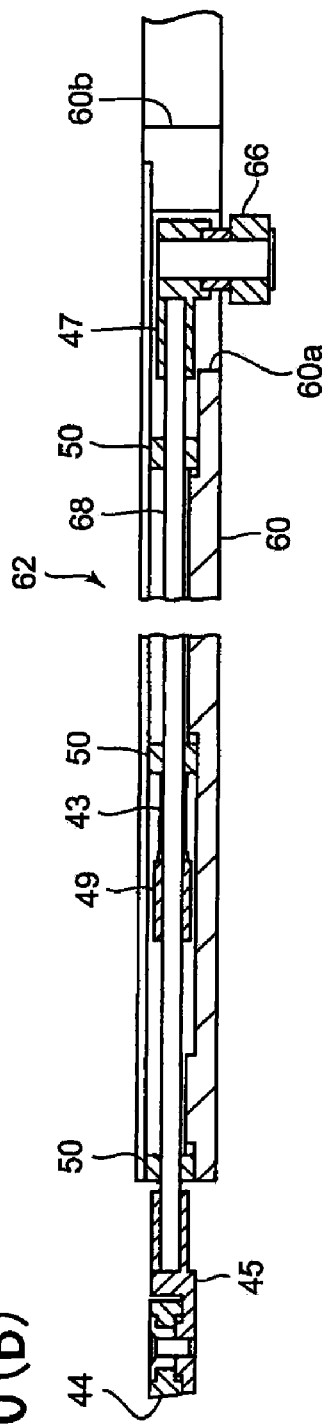
Fig. 10(A)
Fig. 10(B)

US 8,297,907 B2

INDUSTRIAL ROBOT

CROSS REFERENCE TO RELATED APPLICATION

The present invention claims priority under 35 U.S.C. §119 to Japanese Application No. 2007-255108 filed Sep. 28, 2007 the entire contents of which are incorporated herein by reference.

FIELD OF THE INVENTION

At least an embodiment of the present invention may relate to an industrial robot for conveying a conveying object.

BACKGROUND OF THE INVENTION

Conventionally, an industrial robot has been widely used in which a conveying object is conveyed out from an accommodating part which accommodates conveying objects or a conveying object is conveyed into an accommodating part. As this type of an industrial robot, an industrial robot has been known in which a semiconductor wafer, which is a conveying object, is conveyed out from a vacuum chamber, which is an accommodating part, or a semiconductor wafer is conveyed into the vacuum chamber (see, for example, Japanese Patent Laid-Open No. 2000-308988).

The industrial robot which is described in the above-mentioned Patent Reference is incorporated in a manufacturing system for a semiconductor device. A semiconductor wafer is conveyed out by the industrial robot from a load lock chamber (vacuum chamber) into which a semiconductor wafer is conveyed from the outside or the semiconductor wafer is conveyed into a process chamber (vacuum chamber) for performing a predetermined processing on the semiconductor wafer. Further, the industrial robot is disposed in a transfer chamber (vacuum chamber) around which the load lock chamber and the process chamber are disposed.

In recent years, increasing of a conveying speed for a semiconductor wafer has been required in an industrial robot in order to improve productivity. On the other hand, even at a high conveying speed, a semiconductor wafer is required to be held firmly on a hand so as not to occur positional displacement of the semiconductor wafer on the hand on which the semiconductor wafer is placed. In an industrial robot used in the atmosphere, a method in which a semiconductor wafer is held by vacuum suction has been widely utilized but, in an industrial robot disposed in a vacuum chamber, a semiconductor wafer cannot be held by vacuum suction. Therefore, in the above-mentioned Patent Reference, a mechanical clamp mechanism for holding a semiconductor wafer on a hand is proposed as a means for coping with a demand for increasing of a conveying speed.

The clamp mechanism proposed in the Patent Reference includes a lever mechanism, which is mounted on the hand to abut with a semiconductor wafer, and an operation member for operating the lever mechanism which is mounted on an arm that holds the hand turnably. Further, the operation member is disposed at an eccentric position with respect to a turning center of the hand.

However, in the clamp mechanism described in the above-mentioned Patent Reference, the operation member is disposed at the eccentric position with respect to the turning center of the hand and thus the size of the clamp mechanism is increased in a radial direction. Therefore, in the industrial robot described in the Patent Reference, it is difficult to reduce the size in the radial direction of a connecting portion of the arm with the hand and, as a result, downsizing of the industrial robot becomes difficult.

SUMMARY OF THE INVENTION

In view of the problems described above, at least an embodiment of the present invention may advantageously provide an industrial robot which is capable of reducing its size even when a conveying object is held in a mechanical structure.

Thus, according to at least an embodiment of the present invention, there may be provided an industrial robot for conveying a conveying object including a hand having a mounting part for mounting the conveying object, the mounting part is provided with a holding part which is capable of abutting with the conveying object to hold the conveying object and an urging member which urges the holding part, an articulated arm part which includes at least two arms including a hand holding arm that turnably holds the hand on a tip end side of the hand holding arm and which is extended and folded when the conveying object is conveyed, a main body part which turnably holds the articulated arm part, and a cam member which is provided in the hand holding arm and which is formed with a cam face with which the holding part is abutted and which is relatively turned with respect to the hand around a turning center of the hand with respect to the hand holding arm with an extending and folding operation of the articulated arm part. The cam face is formed so that the holding part is retreated from the conveying object before the conveying object is to be conveyed and, with the extending and folding operation of the articulated arm part when the conveying object is conveyed, the holding part is moved in a direction to hold the conveying object.

In accordance with the embodiment of the present invention, the cam face is formed so that the holding part is retreated from the conveying object before the conveying object is to be conveyed and, with the extending and folding operation of the articulated arm part when the conveying object is conveyed, the holding part is moved in a direction to hold the conveying object. Further, the cam face is formed in the cam member which is relatively turned with respect to the hand around the turning center of the hand. In other words, in the industrial robot in accordance with the embodiment of the present invention, since the cam face is formed in the cam member, even when a conveying object is to be held in a mechanical structure, the size of a connecting portion of the hand holding arm with the hand can be reduced in a radial direction. As a result, the size of the industrial robot can be reduced.

In accordance with an embodiment of the present invention, the hand is provided on both end sides of the hand with a first holding part and a second holding part as the holding part for holding the conveying object, and the cam face includes a first cam face with which the first holding part is abutted and a second cam face with which the second holding part is abutted. According to this structure, even when the hand is provided on both end sides of the hand with two holding parts, i.e., the first holding part and the second holding part for respectively holding a conveying object, the size of the connecting portion of the hand holding arm with the hand can be reduced in the radial direction. Further, the first holding part and the second holding part can be separately operated by the first cam face and the second cam face.

In accordance with an embodiment of the present invention, the industrial robot is provided with the hand including a first hand and a second hand which are capable of being relatively turned to each other and which are disposed in an overlapped manner so that they have respectively the same turning centers to the hand holding arm. According to this structure, conveying objects can be conveyed in and out by using two hands and thus a working hour when the conveying objects are conveyed in and out can be shortened. Further, according to this structure, even when the industrial robot is provided with two hands, i.e., the fast hand and the second hand, the size of the connecting portion of the hand holding arm with the first hand and the second hand can be reduced in the radial direction.

In accordance with an embodiment of the present invention, the hand holding arm is provided, as the cam member, a first cam member with which the holding part of the first hand is abutted and a second cam member with which the holding part of the second hand is abutted. According to this structure, the holding part of the first hand and the holding part of the second hand can be separately operated by the first cam member and the second cam member.

In accordance with an embodiment of the present invention, the holding part is provided with a cam face abutting part which abuts with the cam face on the turning center side of the hand. According to this structure, the position of the holding part can be easily controlled by the cam face at the position on the turning center side of the hand. Further, in this case, when the cam face abutting part is structured of a turnable cam face abutting roller, contact resistance between the cam face and the holding part at the time of relatively turning of the cam member with respect to the hand can be reduced.

In accordance with an embodiment of the present invention, the mounting part is provided with a placing member on which the conveying object is to be placed, and the holding part is disposed on a base end side of the placing member which is the turning center side of the hand. According to this structure, the holding part can be structured by using the mounting part as a base. In addition, it is preferable that the placing member is provided on a tip end side with an abutting part with which an end part of the conveying object is capable of abutting. According to this structure, at the beginning of an extending and folding operation of the articulated arm part when an conveying object is conveyed out from an accommodating part, even when the holding part does not hold the conveying object, the end part of the conveying object is abutted with the abutting part when the extending and folding operation has begun and thus positional displacement of the conveying object is prevented. Further, even when the holding part does not hold the conveying object before the extending and folding operation of the articulated arm part has ended when the conveying object is to be conveyed into the accommodating part, the end part of the conveying object is abutted with the abutting part before the end of the extending and folding operation and thus positional displacement of the conveying object is prevented.

In accordance with an embodiment of the present invention, the holding part is provided with a conveying object abutting part which is abutted with the conveying object. According to this structure, the conveying object placed on the placing member can be easily abutted and held. In this case, it is preferable that the holding part is provided with a conveying object abutting roller which is abutted with the conveying object and is turnable. According to this structure, even when the position of the conveying object is displaced on the hand when the holding part is abutted with the conveying object, the conveying object can be adequately guided to a predetermined position without damaging the conveying object.

In accordance with an embodiment of the present invention, the holding part is linearly moved in a holding direction of the conveying object and in a retreated direction from the conveying object. According to this structure, arrangement space for the holding part can be reduced and the hand can be made smaller and thinner. In this case, in order to perform linear movement, it is preferable that the cam face of the cam member is formed with the turning center of the hand with respect to the hand holding arm as a center, and the holding part is provided with the cam face abutting part which is abed with the cam face. Further, it is preferable that the cam face is formed so that, with a turning operation of the hand with respect to the hand holding arm in accordance with an extending and folding operation of the articulated arm part, before the conveying object is conveyed, the holding part is positioned at a retreated position from the conveying object and, when the articulated arm part performs an extending and folding operation for conveying the conveying object, the holding part is moved in the holding direction of the conveying object by means of that the hand is turned with respect to the hand holding arm.

In accordance with an embodiment of the present invention, the holding part is provided with at least two shaft members which are linearly guided in the holding direction and in the retreated direction. According to this structure, rotation of the holding part with the moving direction of the holding part as a center can be prevented by the two shaft members.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 10(A) is a plan view showing a first holding part shown in FIG. 6(B) and FIG. 10(B) is a cross-sectional view showing the first holding part of the "J-J" cross section in FIG. 10(A).

FIG. 13(A) is a view showing a state where the first holding part is retreated from a wafer and FIG. 13(B) is a view showing a state where the first holding part abuts with and holds the wafer.

DETAILED DESCRIPTION OF THE PREFERRED EMBODIMENTS

An industrial robot in accordance with an embodiment of the present invention will be described below with reference to the accompanying drawings.

Figure 1:
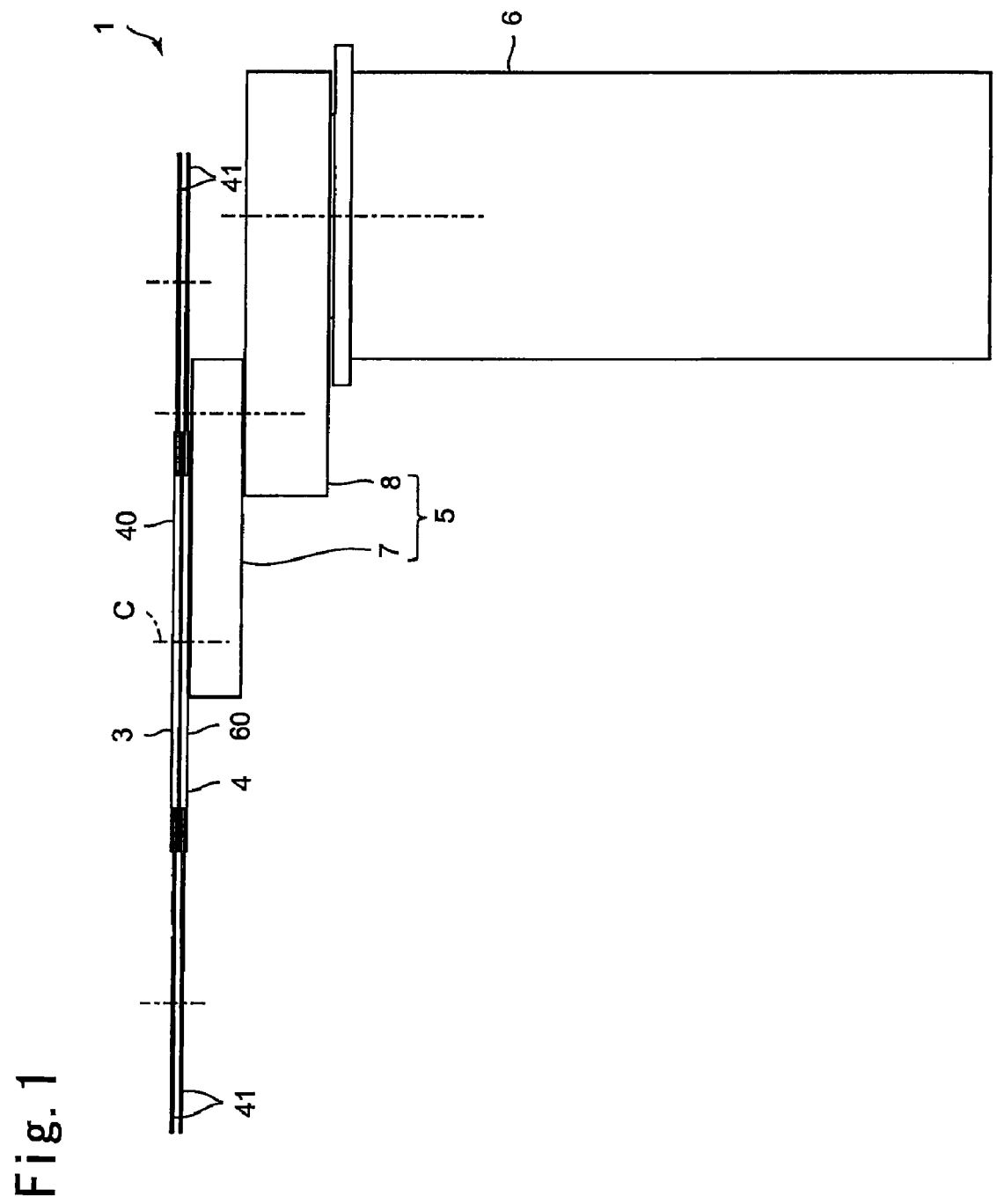
FIG. 1 is a side view showing an industrial robot in accordance with an embodiment of the present invention.
Figure 2A:
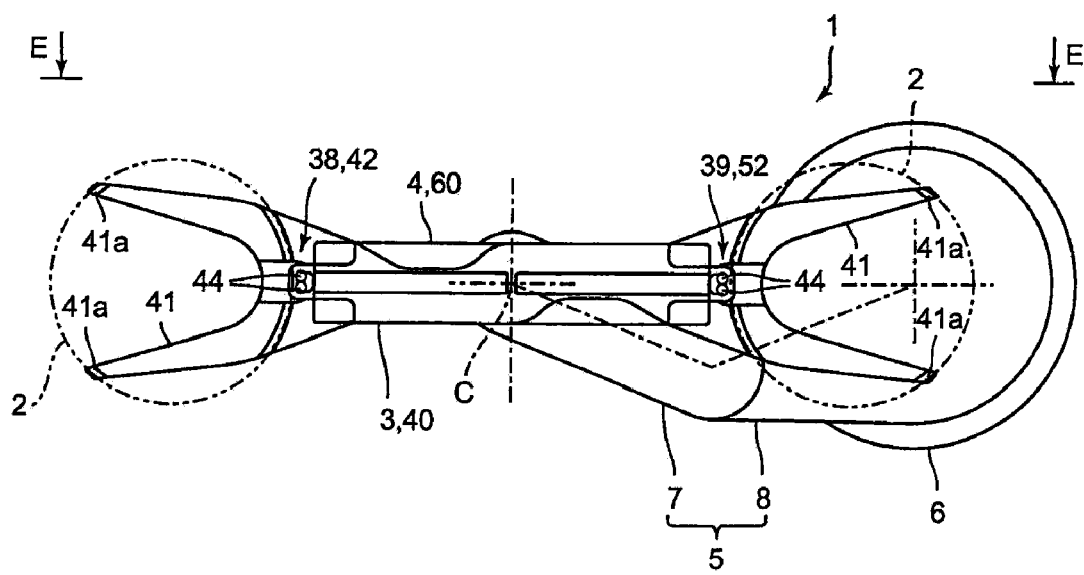
FIG. 2(A) is a plan view showing a closed state of a first hand and a second hand of the industrial robot shown in FIG. 1 where an articulated arm part is extended and FIG. 2(B) is a plan view showing the closed state of the first hand and the second hand where the articulated arm part is folded.
Figure 2B:
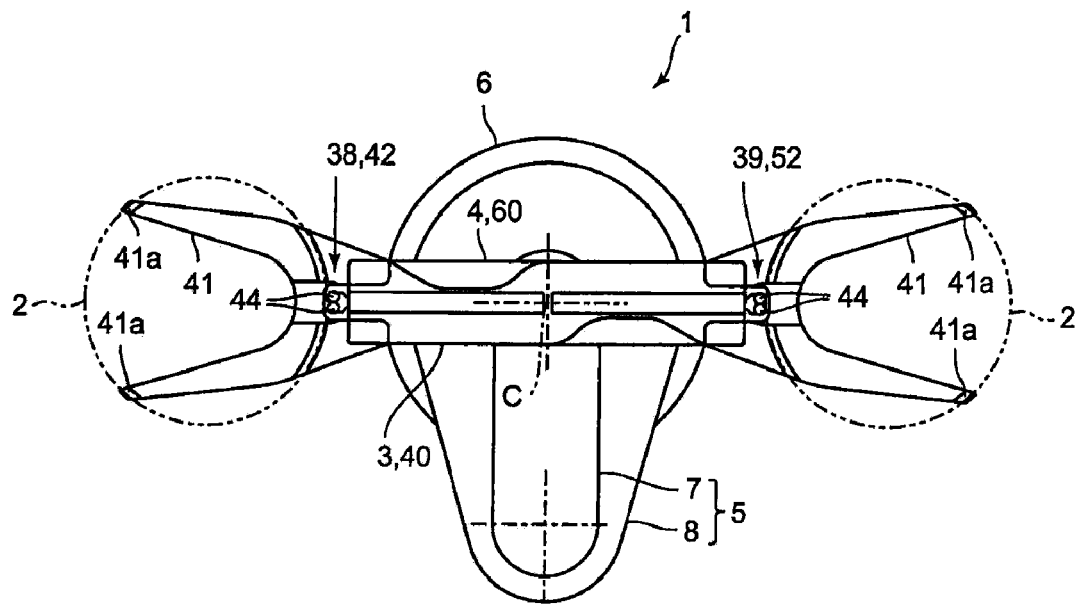
Figure 3A:
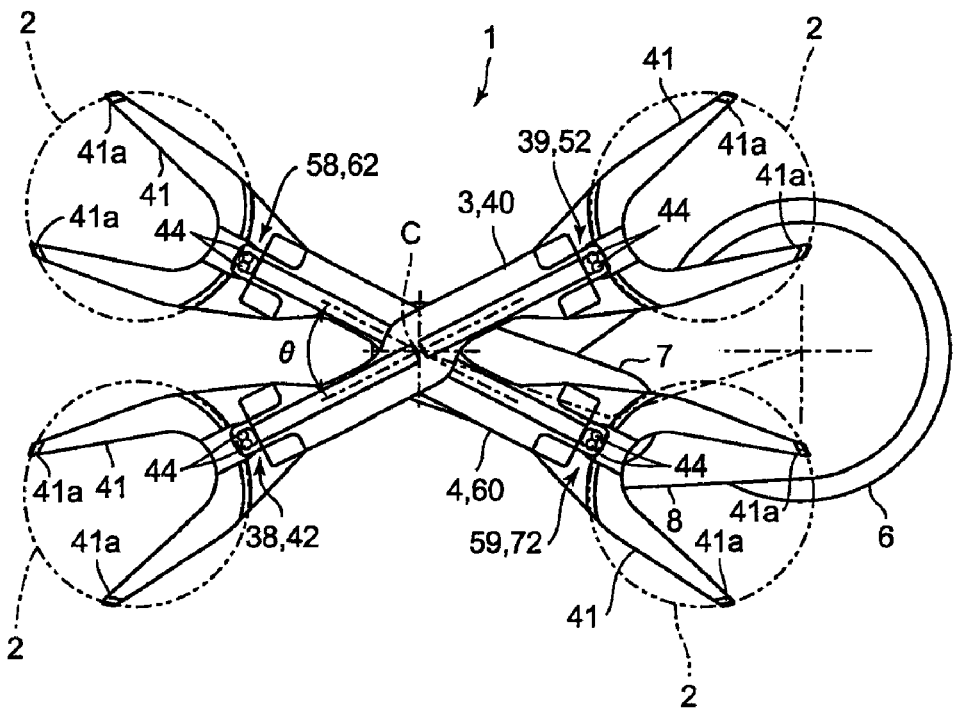
FIG. 3(A) is a plan view showing an opened state of the first hand and the second hand of the industrial robot shown in FIG. 1 where the articulated arm part is extended and FIG. 3(B) is a plan view showing the opened state of the first hand and the second hand where the articulated arm part is folded.
Figure 3B:
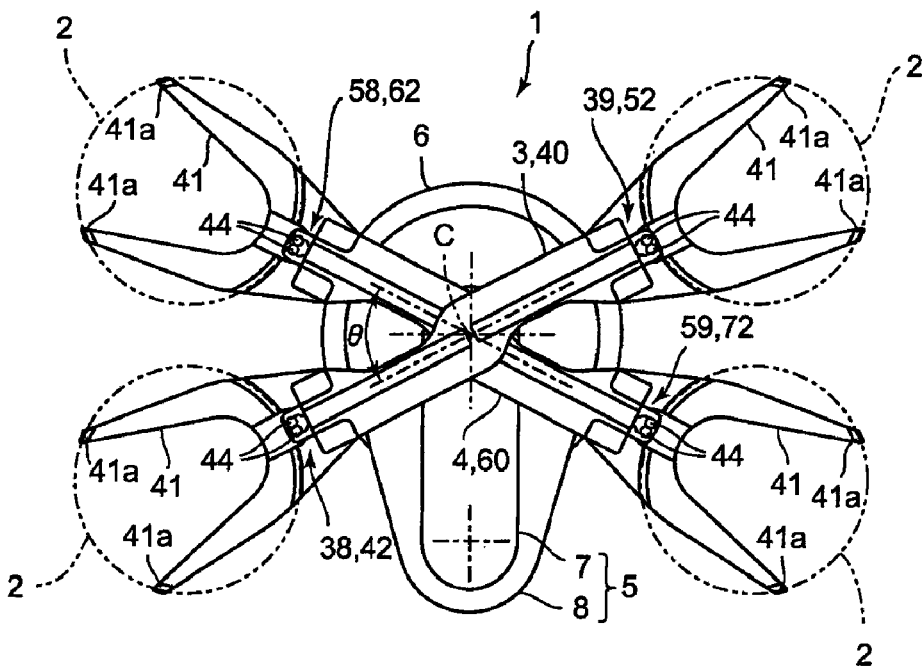
Figure 4:
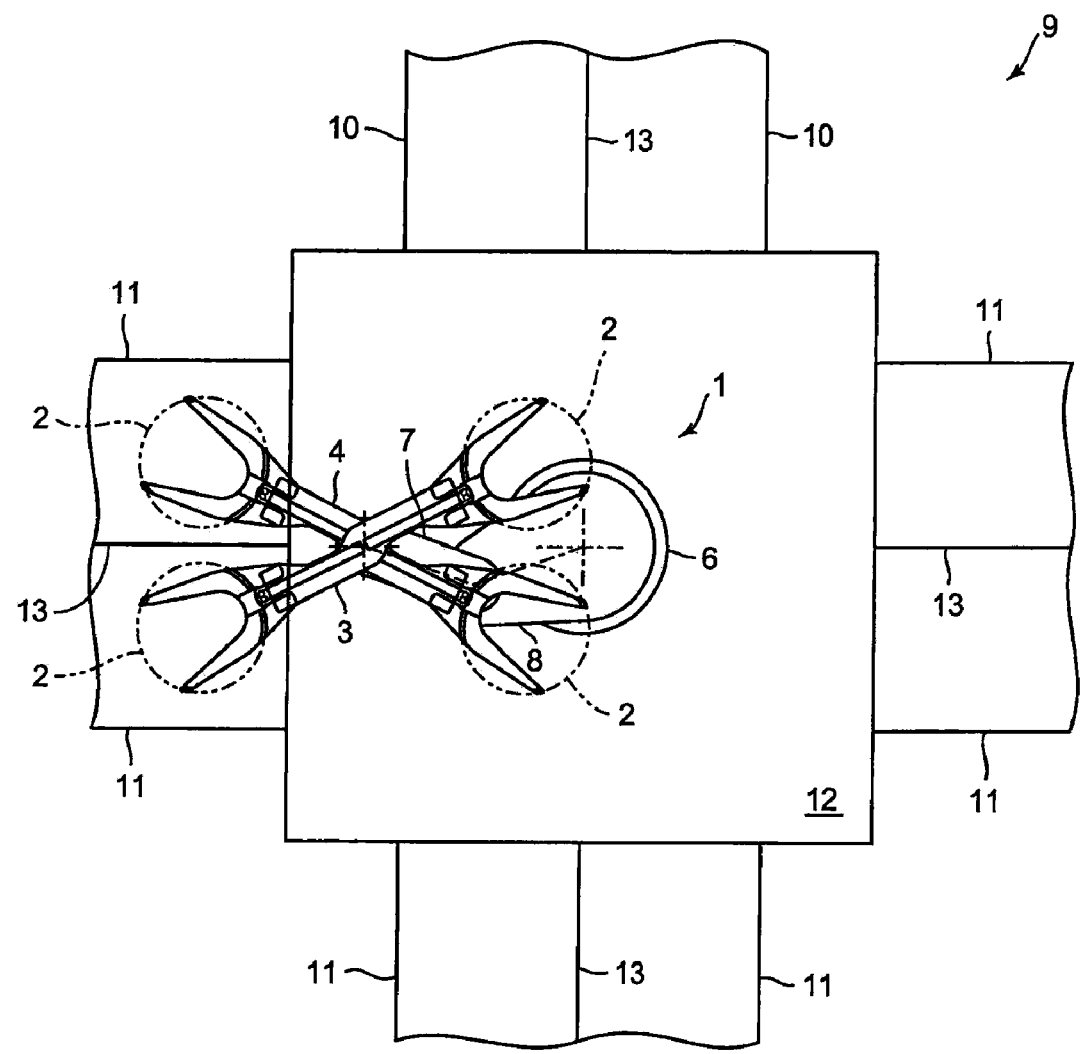
FIG. 4 is a plan view showing a schematic structure of a semiconductor manufacturing system in which the industrial robot shown in FIG. 1 is incorporated.
Figure 5:
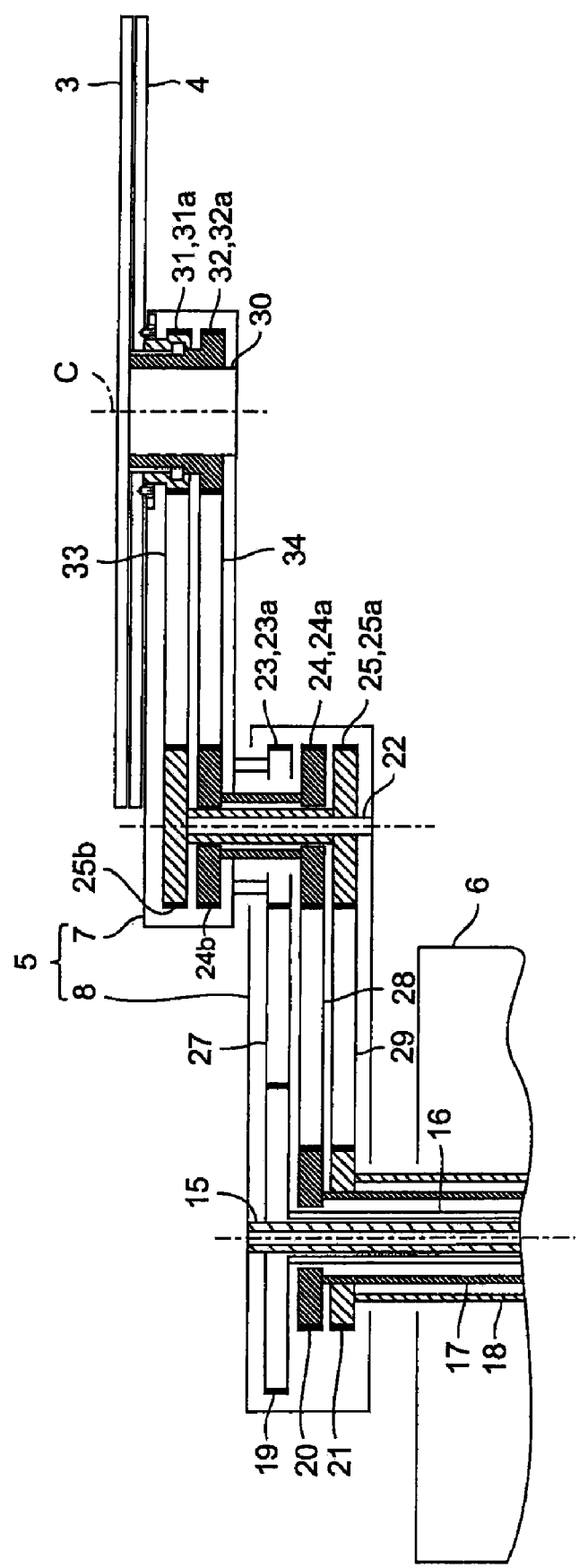
FIG. 5 is a schematic cross-sectional view showing a power transmission mechanism within the articulated arm part and a main body part shown in FIG. 1.

FIG. 1 is a side view showing an industrial robot 1 in accordance with an embodiment of the present invention. FIGS. 2(A) and 2(B) are plan views showing a closed state of a first hand 3 and a second hand 4 of the industrial robot 1 shown in FIG. 1. FIG. 2(A) is a view showing a state where an articulated arm part 5 is extended and FIG. 2(B) is a view showing a state where the articulated arm part 5 is folded. FIGS. 3(A) and 3(B) are plan views showing an opened state of the first hand 3 and the second hand 4 of the industrial robot 1 shown in FIG. 1. FIG. 3(A) is a view showing a state where the articulated arm part 5 is extended and FIG. 3(B) is a view showing a state where the articulated arm part 5 is folded. FIG. 4 is a plan view showing a schematic structure of a semiconductor manufacturing system 9 in which the industrial robot 1 shown in FIG. 1 is incorporated. FIG. 5 is a schematic cross-sectional view showing a power transmission mechanism within the articulated arm part 5 and a main body part 6 shown in FIG. 1. In FIG. 5, a schematic cross section of the articulated arm part 5 and the like is shown when viewed from the "E-E" direction in FIG. 2(A).

The industrial robot 1 in this embodiment (hereinafter, referred to as "robot 1") is a robot for conveying a thin disk-shaped semiconductor wafer 2 (hereinafter, referred to as "wafer 2") which is a conveying object. The robot 1 includes, as shown in FIG. 1 through FIG. 3(B), two hands, i.e., the first hand 3 and the second hand 4 for mounting a wafer 2, the articulated arm part 5 which turnably holds the first hand 3 and the second hand 4 and is extended and folded at the time of conveying the wafer 2, and the main body part 6 which turnably holds the articulated arm part 5. The articulated arm part 5 in this embodiment is structured of two arms, i.e, the second arm 7 and the first arm 8. In this embodiment, when the first hand 3 and the second hand 4 are described collectively, they are described as "hands 3 and 4".

The robot 1 in this embodiment is, for example, incorporated and used in the semiconductor manufacturing system 9 as shown in FIG. 4. Specifically, the robot 1 is incorporated and used in the semiconductor manufacturing system 9 which is provided with receive-and-pass chambers 10 for receiving and passing a wafer 2 between the semiconductor manufacturing system 9 and external equipments (not shown), process chambers 11 for performing a predetermined processing on the wafer 2, and a transfer chamber 12 within which the robot 1 is disposed.

As shown in FIG. 4, in the semiconductor manufacturing system 9, the transfer chamber 12 is formed in a substantially rectangular parallelepiped shape. For example, two receive-and-pass chambers 10 are adjacently disposed on a side face of the transfer chamber 12 and, for example, two process chambers 11 are adjacently disposed on each of three remaining side faces of the transfer chamber 12. A partition wall 13 is formed between the adjacent receive-and-pass chambers 10 and between the process chambers 11. Further, a gate (not shown) for placing and taking out a wafer 2 is disposed between the receive-and-pass chambers 10 or the process chambers 11 and the transfer chamber 12.

The robot 1 disposed within the transfer chamber 12 conveys out a wafer 2 from the receive-and-pass chamber 10 or the process chamber 11 and conveys a wafer 2 into the receive-and-pass chamber 10 or the process chamber 11. In other words, the articulated arm part 5 is extended and folded to place or take out a wafer 2 to or from the receive-and-pass chamber 10 and the process chamber 11. Specifically, when a wafer 2 is to be conveyed in, the folded articulated arm part 5 is extended and the first hand 3 and the second hand 4 are passed through a gate to enter into the inside of the receive-and-pass chamber 10 or the process chamber 11. Further, when the wafer 2 is to be conveyed out, the extended articulated arm part 5, which has been entered into the inside of the receive-and-pass chamber 10 or the process chamber 11, is folded and the first hand 3 and the second hand 4 are passed through the gate to be returned to the transfer chamber 12. In this embodiment, the receive-and-pass chamber 10 and the process chamber 11 are an accommodating part into which a wafer 2, i.e., a conveying object is accommodated.

In this embodiment, the articulated arm part 5 is extended and folded in a closed state (state shown in FIGS. 2(A) and 2(B)) of the first hand 3 and the second hand 4 as described below to place or take out a wafer 2 to or from the receive-and-pass chamber 10. Further, the articulated arm part 5 is extended and folded in an opened state (state shown in FIGS. 3(A) and 3(B)) of the first hand 3 and the second hand 4 as described below to place or take out a wafer 2 to or from the process chamber 11. Further, when a wafer 2 is to be handled, all of the receive-and-pass chamber 10, the process chamber 11 and the transfer chamber 12 are set to be in a vacuum state. In other words, the robot 1 in this embodiment is used in a vacuum state.

As shown in FIG. 1 through FIG. 3(B), a substantially center portion of the first hand 3 is turnably connected with a tip end of the second arm 7. Further, a substantially center portion of the second hand 4 is also turnably connected with the tip end of the second arm 7. Specifically, the substantially center portion of the first hand 3 and the substantially center portion of the second hand 4 are connected with the tip end of the second arm 7 so that a turning center of the first hand 3 and a turning center of the second hand 4 to the second arm 7 are set to be the same turning center C.

Further, the first hand 3 and the second hand 4 are relatively turnable to each other with respect to the second arm 7. In other words, the first hand 3 and the second hand 4 are separately turnable with respect to the second arm 7. Therefore, the first hand 3 and the second hand 4 in this embodiment become an overlapped state in an up-and-down direction (closed state) as shown in FIGS. 2(A) and 2(B) and, as shown in FIGS. 3(A) and 3(B), they do not overlap with each other in the up-and-down direction to be in a substantially "X" shape (opened state). In this embodiment, the state shown in FIGS. 3(A) and 3(B) is the most opened state of the first hand 3 and the second hand 4. The robot 1 is used in a state where an angle formed by the fit hand 3 and the second hand 4 is set to be the angle θ shown in FIGS. 3(A) and 3(B) or less.

A base end side of the second arm 7 is turnably connected to a tip end side of the first arm 8. A base end side of the first arm 8 is turnably connected to the main body part 6. Further, in the up-and-down direction, the first hand 3, the second hand 4, the second arm 7, the first arm 8 and the main body part 6 are disposed in this order from the upper side. In this embodiment, the second arm 7 is a hand holding arm which turnably holds the first hand 3 and the second hand 4 at its tip end side.

An outside shape of the main body part 6 is formed in a substantially cylindrical shape. The main body part 6 includes, as shown in FIG. 5, a first hollow rotation shaft 15 disposed at a center portion in a radial direction, a second hollow rotation shaft 16 which is concentrically disposed with the first hollow rotation shaft 15 so as to surround an outer peripheral face of the first hollow rotation shaft 15, a third hollow rotation shaft 17 which is concentrically disposed with the first hollow rotation shaft 15 so as to surround an outer peripheral face of the second hollow rotation shaft 16, and a fourth hollow rotation shaft 18 which is concentrically disposed with the first hollow rotation shaft 15 so as to surround an outer peripheral face of the third hollow rotation shaft 17. The first through fourth hollow rotation shafts 15 through 18 are relatively turnable each other and the main body part 6 is provided with four drive motors (not shown) for separately turning the respective the first though the fourth hollow rotation shafts 15 through 18.

As shown in FIG. 5, the first arm 8 and the second arm 7 are formed in a substantially hollow shape having a hollow part.

An upper end of the first hollow rotation shaft 15 is fixed to an upper face portion on a base end side of the first arm 8. Pulleys 19, 20 and 21 are respectively fixed to upper ends of the second through the fourth hollow rotation shafts 16 through 18.

The upper end portions of the first through the fourth hollow rotation shafts 15 through 18 are disposed in the inside on the base end side of the first arm 8 and the pulleys 19 through 21 are disposed in this order from the upper side. Further, a fixed shaft 22 is fixed in the inside of a tip end side of the first arm 8. The fixed shaft 22 is inserted into three pulleys 23, 24 and 25 in this order from the upper side. The pulleys 23 through 25 are turnably supported by the fixed shaft 22, which is their turning center. Further, the pulleys 23 through 25 are fitted to the fixed shaft 22 so as to be relatively turnable each other.

The pulley 23 is fixed to a bottom face on the base end side of the second arm 7. Further, a pulley part 23*a* (portion over which a belt is stretched) of the pulley 23 is disposed in the inside of the tip end side of the first arm 8. The pulley 24 is provided with a first pulley part 24*a*, which is disposed in the inside of the tip end side of the first arm 8, and a second pulley part 24*b* which is disposed in the inside of the base end side of the second arm 7. The pulley 25 is similarly provided with a first pulley part 25*a* disposed in the inside of the tip end side of the first arm 8 and a second pulley part 25*b* disposed in the inside of the base end side of the second arm 7.

A belt 27 is stretched between the pulley 19 and the pulley 23 (pulley part 23*a*). Further, a belt 28 is stretched between the pulley 20 and the first pulley part 24*a*, and a belt 29 is stretched between the pulley 21 and the first pulley part 25*a*.

Second pulley parts 25*b* and 24*b* are disposed in the inside of the base end side of the second arm 7 in his order from the upper side. Further, a fixed shaft 30 is fixed in the inside on a tip end side of the second arm 7. The fixed shaft 30 is inserted into two pulleys 31 and 32, which are turnably supported by the fixed shaft 30 that is their turning center. Further, the pulleys 31 and 32 are fitted to the fixed shaft 30 so as to be relatively turnable each other.

The pulley 31 is fixed to a bottom face of a substantially center portion of the second hand 4. Further, a pulley part 31*a* of the pulley 31 is disposed in the inside on the tip end side of the second arm 7. The pulley 32 is fixed to a bottom face at a substantially center portion of the first hand 3. Further, a pulley part 32*a* of the pulley 32 is disposed in the inside on the tip end side of the second arm 7. Specifically, the pulley part 32*a* is disposed on a lower side of the pulley part 31*a*. A belt 33 is stretched between the second pulley part 25*b* and the pulley 31. Further, a belt 34 is stretched between the second pulley part 24*b* and pulley 32.

Detail structures of the first hand 3 and the second hand 4 and detail structures of connecting portions of the first hand 3 and the second hand 4 with the second arm 7 will be described below.

In this embodiment, in a state where the second hollow rotation shaft 16 is stopped, when the first hollow rotation shaft 15, the third hollow rotation shaft 17 and the fourth hollow rotation shaft 18 are turned, the articulated arm part 5 is extended and folded without changing relative position between the first hand 3 and the second hand 4. In other words, in a state where a drive motor for the second hollow rotation shaft 16 is stopped, when a drive motor for the first hollow rotation shaft 15, a drive motor for the third hollow rotation shaft 17 and a drive motor for the fourth hollow rotation shaft 18 are driven, the articulated arm part 5 is extended and folded without changing relative position between the first hand 3 and the second hand 4.

Further, it is structured that, when the first through the fourth hollow rotation shafts 15 through 18 are turned, the articulated arm part 5 is turned around the main body part 6 without changing the relative position between the first hand 3 and the second hand 4 and without extending and folding the articulated arm part 5. In other words, when the respective drive motors for the first through the fourth hollow rotation shafts 15 through 18 are driven, the articulated arm part 5 performs a turning operation without changing the relative position between the first hand 3 and the second hand 4.

In addition, in a state where the first hollow rotation shaft 15 and the second hollow rotation shaft 16 are stopped, when the third hollow rotation shaft 17 and the fourth hollow rotation shaft 18 are turned, it is structured that the first hand 3 and the second hand 4 are turned with respect to the articulated arm 5 without being extended or folded and without being turned of the articulated arm part 5. In other words, in a state where the drive motors for the first hollow rotation shaft 15 and the second hollow rotation shaft 16 are stopped, when the drive motor for the third hollow rotation shaft 17 and the drive motor for the fourth hollow rotation shaft 18 are driven, the first hand 3 and the second hand 4 perform a turning operation without being extended or folded and without being turned of the articulated arm part 5.

Further, it is structured that, in a state where the first hollow rotation shaft 15 and the second hollow rotation shaft 16 are stopped, when the third hollow rotation shaft 17 and the fourth hollow rotation shaft 18 are turned, the first hand 3 and the second hand 4 are closed (overlapped with each other in the up-and-own direction) or opened (not overlapped in the up-and-down direction and disposed in a substantially X-shape) without being extended or folded and without being turned of the articulated arm part 5. In other words, in a state where the drive motors for the first hollow rotation shaft 15 and the second hollow rotation shaft 16 are stopped, when the drive motor for the third hollow rotation shaft 17 and the fourth hollow rotation shaft 18 are turned, the first hand 3 and the second hand 4 perform an opening and closing operation without being extended or folded and without being tuned of the articulated arm part 5.

In this embodiment, a center-distance between the first hollow rotation shaft 15 and the fixed shaft 22 and a center-distance between the fixed shaft 22 and the fixed shaft 30 are set to be equal to each other. Further, in this embodiment, diameters of the pulleys 20, 21, 23, 31 and 32, diameters of the first pulley parts 24*a* and 25*a*, and diameters of the second pulley parts 24*b* and 25*b* are set to be equal. In addition, a diameter of the pulley 19 is set to be two times of that of the pulley 20 and the like.

Therefore, at the time of extending and folding operation of the articulated arm part 5, angles between the first hand 3 and the second arm 7 and between the second hand 4 and the second arm 7, and an angle between the second arm 7 and the first arm 8 are changed. However, the first hand 3 and the second hand 4 move on an imaginary straight line, which is formed by connecting the center of the first hollow rotation shaft 15 (i.e., the center of the main body part 6) with the center of the fixed shaft 30 (i.e., the turning center C of the first hand 3 and the second hand 4), in a state where their directions are fixed. In other words, the robot 1 in this embodiment is a so called cylindrical type robot in which the first hand 3 and the second hand 4 are radially moved in a state where they are directed in a fixed direction when the articulated arm part 5 are extended and folded.

FIG. 2(A) and FIG. 3(A) show the state where the articulated arm part 5 is extended most and, in this state, conveying out of a wafer 2 from the receive-and-pass chamber 10 or the process chamber 11 is started. Further, FIG. 2(B) and FIG. 3(B) show the state where the articulated arm part 5 is folded most and, in this state, conveying a wafer 2 into the receive-and-pass chamber 10 or the process chamber 11 is started.

Figure 6:
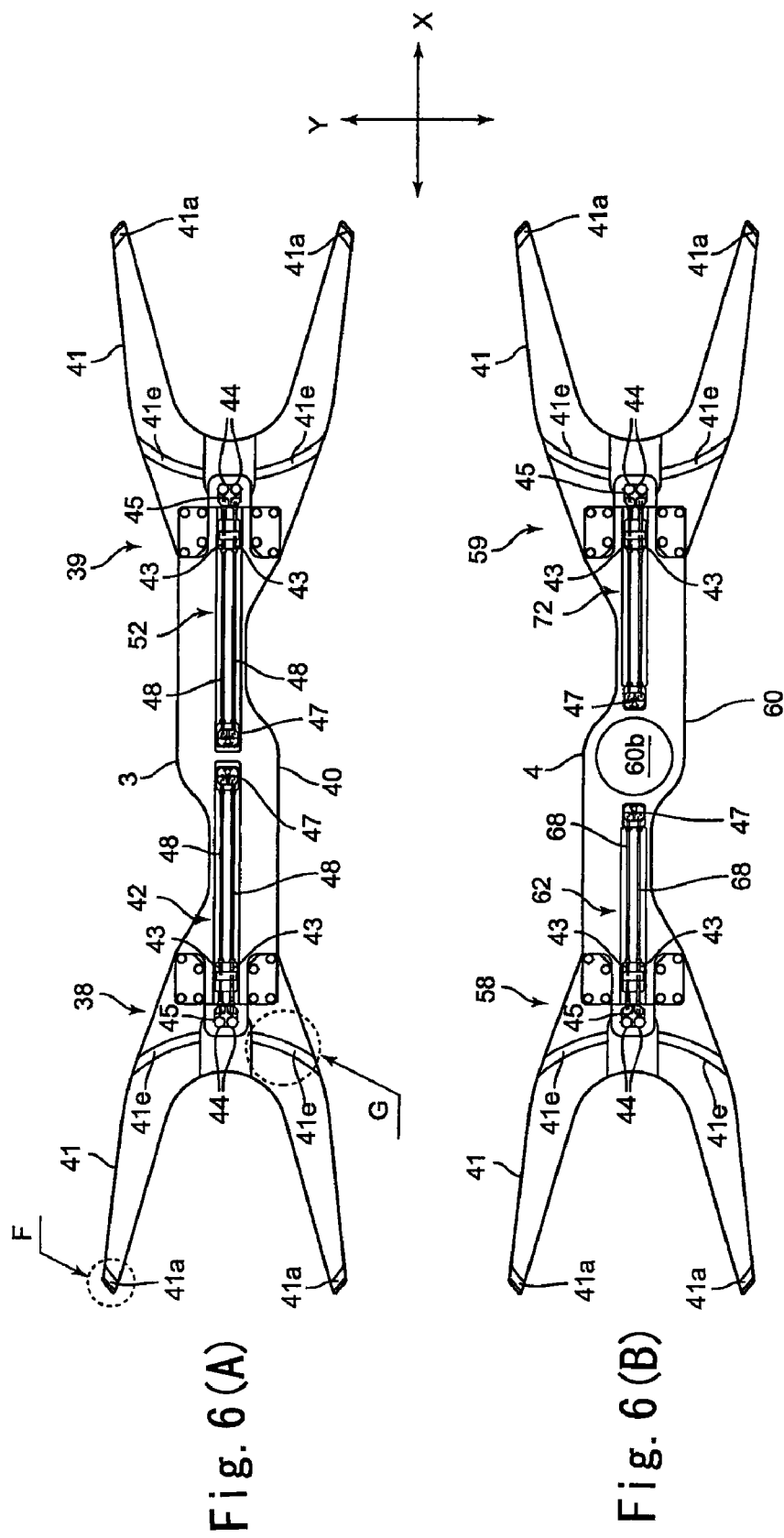
FIG. 6(A) is a plan view showing the first hand in FIG. 1
FIG. 6(B) is a plan view showing the secondhand in FIG. 1.
Figure 7:
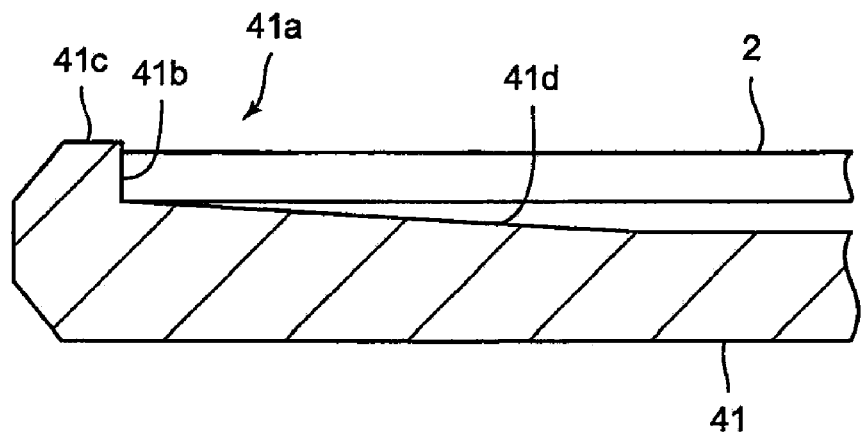
FIG. 7 is a cross-sectional side view showing a structure of the part "F" in FIG. 6(A).
Figure 8:
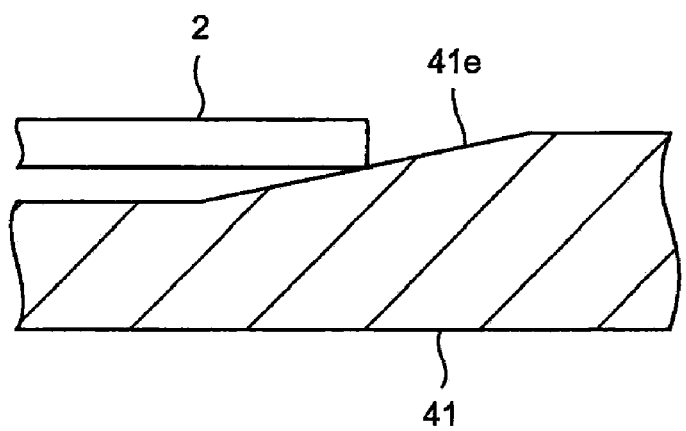
FIG. 8 is a cross-sectional side view showing a structure of the part "G" in FIG. 6(A).
Figure 9:
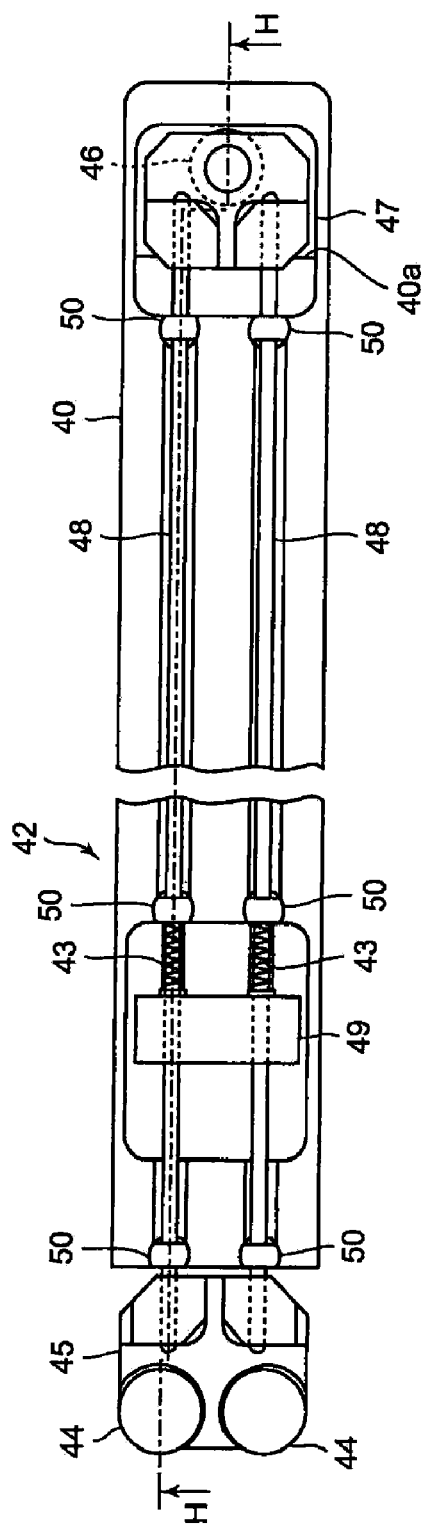
FIG. 9(A) is a plan view showing a first holding part shown in FIG. 6(A) and FIG. 9(B) is a cross-sectional view showing the first holding part of the "H-H" cross section in FIG. 9(A).
Figure 9:
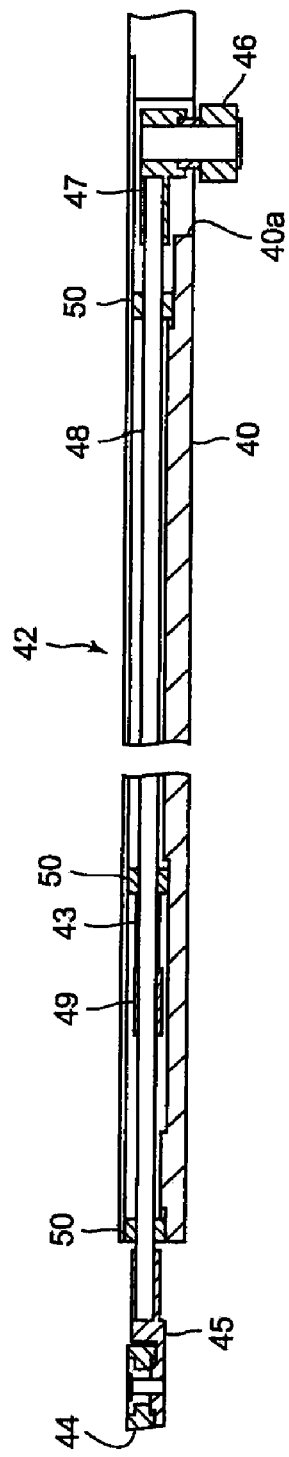

FIG. 6(A) is a plan view showing the first hand 3 in FIG. 1 and FIG. 6(B) is a plan view showing the second hand 4 in FIG. 1. FIG. 7 is a cross-sectional side view showing a structure of the part "F" in FIG. 6(A). FIG. 8 is a cross-sectional side view showing a structure of the part "G" in FIG. 6(A). FIG. 9(A) is a plan view showing a first holding part 42 shown in FIG. 6(A) and FIG. 9(B) is a cross-sectional view showing the first holding part 42 of the "H-H" cross section in FIG. 9(A). FIG. 10(A) is a plan view showing a first holding part 62 shown in FIG. 6(B) and FIG. 10(B) is a cross-sectional view showing the first holding part 62 of the "J-J" cross section in FIG. 10(A). In this embodiment in the structure of the first hand 3 and the second hand 4, for convenience of their description, the "X"-direction in FIG. 6(A) is set to be in a forward and backward direction and the "Y"-direction in FIG. 6(A) is set to be in a right and left direction.

The first hand 3 is, as shown in FIG. 6(A), provided with a first mounting part 38 and a second mounting part 39 as a mounting part for mounting a wafer 2 on both ends in the forward and backward direction and a base member 40 on which the first mounting part 38 and the second mounting part 39 are fixed. The first hand 3 is, as shown in FIG. 6(A), structured in a substantially point symmetrical manner with respect to the center of the first hand 3 when viewed in the vertical direction.

The first mounting part 38 is provided with a placing member 41 for placing a wafer 2, a first holding part 42 which abuts with an end part of the wafer 2 to hold the wafer 2, and compression coil springs 43 (see FIGS. 9(A) and 9(B)) as an urging member for urging the first holding part 42 in a direction for holding the wafer 2.

The placing member 41 is a thin plate-shaped member which is formed of, for example, ceramic. Further, the placing member 41 is formed in a roughly "U" shape which opens toward an outer side in the forward and backward direction (tip end side). A base end of the placing member 41 is fixed to an end part of the base member 40.

A tip end side of the placing member 41 is formed with an abutting part 41*a* which is capable of abutting with an end part of a wafer 2. Specifically, as shown in FIG. 7, the abutting part 41*a* is structured of a protruded part 41*c* provided with a vertical face 41*b*, which is formed at the tip end side of the placing member 41 so as to abut with an end part of a wafer 2, and an inclined face 41*d* which abuts with a lower end of the end part of the wafer 2. Further, the abutting part 41*a* is formed in a substantially circular arc shape along an outer periphery of the wafer 2.

The inclined face 41*d* is formed from the lower end of the vertical face 41*b* toward the base end side of the placing member 41 so as to gradually go down toward the base end side. The vertical face 41*b* functions to hold the wafer 2 along with the first holding part 42 as described below. Further, the vertical face 41*b* functions to prevent positional displacement of the wafer 2 at the time of conveying in and out of the wafer 2 as described below.

An inclined face 41*e* with which a lower end of an end part of the wafer 2 is abutted is formed on the base end side of the placing member 41. Specifically, as shown in FIG. 8, the inclined face 41*e* is formed so as to gradually go down toward the tip end side. Further, the inclined face 41*e* is formed in a substantially circular arc shape along an outer periphery of the wafer 2.

The first holding part 42 is disposed on the base end side of the placing member 41. Specifically, the first holding part 42 is mounted on an upper face of the base member 40 over a roughly half area of the base member 40 in the forward and backward direction. Further, the first holding part 42 is disposed at a substantially center position of the first hand 3 in the right and left direction.

The first holding part 42 includes, as shown in FIGS. 9(A) and 9(B), two conveying object abutting rollers 44 as a conveying object abutting part, which are capable of abutting with a wafer 2 and are rotatable, a substantially block-shaped holding member 45 for rotatably holding two rollers 44, a rotatable cam face abutting roller 46 as a cam face abutting part, which abuts with a first cam face 83*k* of a first cam member 83 described below, a substantially block-shaped holding member 47 for rotatably holding the roller 46, and two shaft members 48 for guiding the rollers 44 and 46 and the holding members 45 and 47 in the forward and backward direction. The holding member 45 is fixed to one ends (tip end side) of two shaft members 48 and the holding member 47 is fixed to the other ends (base end side) of two shaft members 48. The conveying object abutting roller 44 and the cam face abutting roller 46 are used because they are preferable to decrease their abutting frictions. However, when its abutting friction is not large so much, the abutting part may be directly abutted without using a roller.

Two rollers 44 are rotatably mounted on the tip end side of the holding member 45 so that they are apart from each other in a predetermined distance in the right and left direction. Further, the roller 44 is mounted on the holding member 45 so as to protrude a little on the tip end side of the tip end of the holding member 45 so that the roller 44 can abut with a wafer 2.

The holding member 47 is, as shown in FIG. 9(B), disposed within a through-hole 40*a* described below which is formed on a center side of the base member 40. Further, the roller 46 is rotatably mounted on the holding member 47 so as to protrude in a downward direction from a bottom face of the base member 40.

The shaft member 48 is formed in an elongated cylindrical shape. A spring abutting member 49 with which one ends of compression coil springs 43 (left end in FIGS. 9(A) and 9(B)) are abutted is fixed to the shaft member 48. Specifically, one piece of the spring abutment member 49 is fixed to two shaft members 48.

Two shaft members 48 are held by slide bearings 50 which are fixed on an upper face of the base member 40 in the state that they are apart from each other with a predetermined distance in the right and left direction. Specifically, each of the shaft members 48 is held by three slide bearings 50 which are disposed so as to have predetermined spaces between them in the forward and backward direction. In this embodiment, the two shaft members 48 are linearly guided in the forward and backward direction by the slide bearings 50. In other words, two shaft members 48 are linearly guided by the slide bearings 50 in a holding direction for holding a wafer 2 (left direction in FIGS. 9(A) and 9(B)) and in a retreated direction for retreating from the wafer 2 (right direction in FIGS. 9(A) and 9(B)). Therefore, the first holding part 42 in this embodiment linearly moves in the holding direction and in the retreated direction.

The shaft member 48 is passed through an inner peripheral side of the compression coil spring 43. Further, the spring abutting member 49 is disposed between the slide bearings 50 which are disposed in a state that they are apart from each other with a predetermined distance in the forward and backward direction, and the other end of the compression coil spring 43 (right end in FIGS. 9(A) and 9(B)) abuts with the slide bearing 50. Therefore, the shaft member 48 is urged by the compression coil spring 43 in the holding direction of a wafer 2. In other words, the first holding part 42 is urged by the compression coil spring 43 in the holding direction of the wafer 2. Further, the roller 46 is abutted with the first cam face 83$k$ described below with a predetermined abutting force by an urging force of the compression coil spring 43. In this embodiment, the compression coil spring 43 urges the wafer 2 in the holding direction. However, it may be structured that the roller 46 is urged in a direction separating from the wafer 2 by the compression coil spring 43 and the roller 46 is moved by the first cam face 83$k$ in the holding direction of the wafer 2.

As described above, the first hand 3 is structured in a substantially point symmetrical manner with respect to the center of the first hand 3 when viewed in the vertical direction. In other words, the second mounting part 39 is similarly structured to the first mounting part 38 and is disposed in a symmetrical manner to the first mounting part 38 with respect to the center of the base member 40 in the forward and backward direction. Therefore, detailed description of the second mounting part 39 is omitted.

The second mounting part 39 is provided with a second holding part 52 which is similarly structured to the first holding part 42. The second holding part 52 is provided with a rotatable cam face abutting roller 56 (see FIG. 11) as a cam face abutting part which corresponds to the above-mentioned roller 46 and which abuts with a second cam face 83$m$ of the first cam member 83. In FIG. 6(A) and the like, the same notational symbols are used in the structure of the second mounting part 39 which is the same as the structure described above.

The base member 40 is formed in a roughly rectangular plate shape whose longitudinal direction is the forward and backward direction. As shown in FIG. 9(B), a through-hole 40$a$ within which the holding member 47 is disposed is formed at a center portion of the base member 40 so as to penetrate in the vertical direction.

The second hand 4 is, as shown in FIG. 6(B), provided with a first mounting part 58 and a second mounting part 59 for mounting a wafer 2 on both ends in the forward and backward direction and a base member 60 on which the first mounting part 58 and the second mounting part 59 are fixed. The second hand 4 is, similarly to the first hand 3, structured in a substantially point symmetrical manner with respect to the center of the second hand 4 when viewed in the vertical direction. Further, in this embodiment, a length in the forward and backward direction of the first hand 3 and a length in the forward and backward direction of the second hand 4 are set to be equal to each other.

The first mounting part 58 is structured to be similar to the above-mentioned first mounting part 38. Specifically, the first mounting part 58 is provided with the above-mentioned placing member 41 and the compression coil springs 43 and is provided with the first holding part 62 which is structured to be similar to the first holding part 42.

The first holding part 62 is, as shown in FIGS. 10(A) and 10(B), structured similarly to the first holding part 42 except that the first holding part 62 is provided with a rotatable cam face abutting roller 66 as a cam face abutting part, which abuts with a first cam face 84$k$ of a second cam member 84 described below, instead of the roller 46 and, except that two shaft members 68 are shorter than the shaft members 48. Therefore, detailed description of the first holding part 62 is omitted. In FIG. 6(B), FIGS. 10(A) and 10(B) and the like, the same notational symbols are used in the structure of the first mounting part 58 which is the same as the structure described above.

Further, as described above, the second hand 4 is structured in a substantially point symmetrical manner with respect to the center of the second hand 4 when viewed in the vertical direction. In other words, the second mounting part 59 is similarly structured to the first mounting part 58 and is disposed in a symmetrical manner to the first mounting part 58 with respect to the center of the base member 60 in the forward and backward direction. Therefore, detailed description of the second mounting part 59 is also omitted.

The second mounting part 59 is provided with a second holding part 72 which is similarly structured to the first holding part 62. The second holding part 72 is provided with a rotatable cam face abutting roller 76 (see FIG. 11) as a cam face abutting art which corresponds to the above-mentioned roller 66 and which is abutted with a second cam face 8$m$ of the second cam member 84. In FIG. 6(B) and the like, the same notational symbols are used in the structure of the second mounting part 59 which is the same as the structure described above.

As described above, the shaft members 68 are formed shorter than the shaft members 48 and the rollers 66 and 76 are disposed on outer sides of the rollers 46 and 56 in the forward and backward direction. In other words, as shown in FIGS. 6(A) and 6(B), the holding members 47 by which the rollers 66 and 76 are held are disposed on the outer sides of the holding members 47 by which the rollers 46 and 56 are held in the forward and backward direction.

The base member 60 is formed in a roughly rectangular plate shape whose longitudinal direction is the forward and backward direction. As shown in FIG. 10(B), a through-hole 60$a$ within which the holding member 47 is disposed is formed at a center portion of the base member 60 so as to penetrate in the vertical direction. As described above, since the holding members 47 where the rollers 66 and 76 are held are disposed on the outer sides in the forward and backward direction of the holding members 47 where the rollers 46 and 56 are held, the through-hole 60$a$ is formed on the outer side in the forward and backward direction of the through-hole 40$a$ (see FIG. 11).

Further, a through-hole 60$b$ within which an upper end portion of the pulley 32 and the like is disposed is formed at the center of the base member 60 so as to penetrate in the vertical direction as described below. Specifically, a circular through-hole 60$b$ having a radius larger than a distance from the turning center "C" of the first hand 3 to the forming portion of the through-hole 40$a$ is formed at the center of the base member 60.

Figure 11:
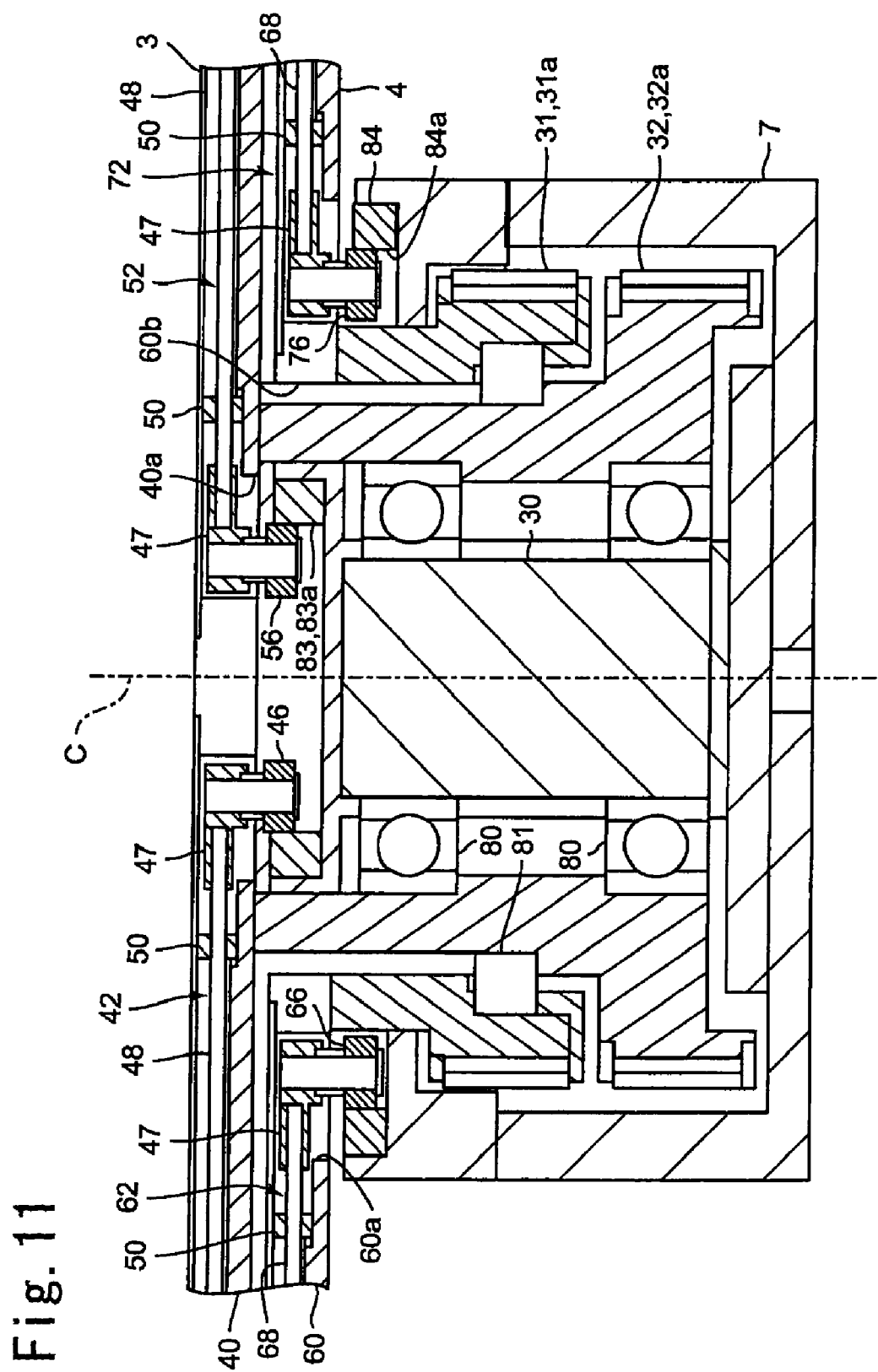
FIG. 11 is a cross-sectional view showing a connecting portion of the first hand and the second hand with a second arm shown in FIG. 1.
Figure 12:
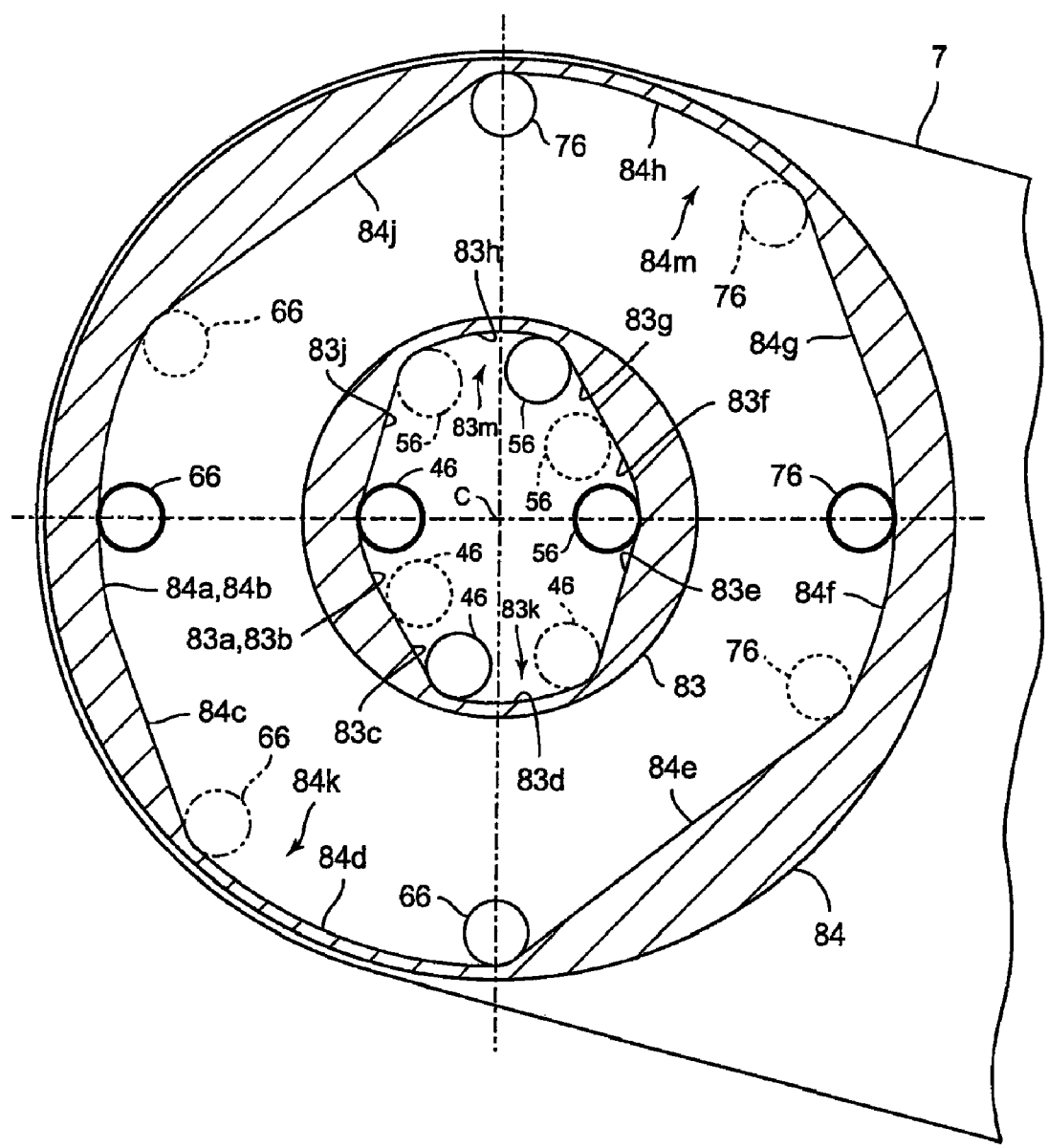
FIG. 12 is a cross-sectional view showing a positional relationship between a first cam member and a second cam member and rollers shown in FIG. 11.
Figure 13A:
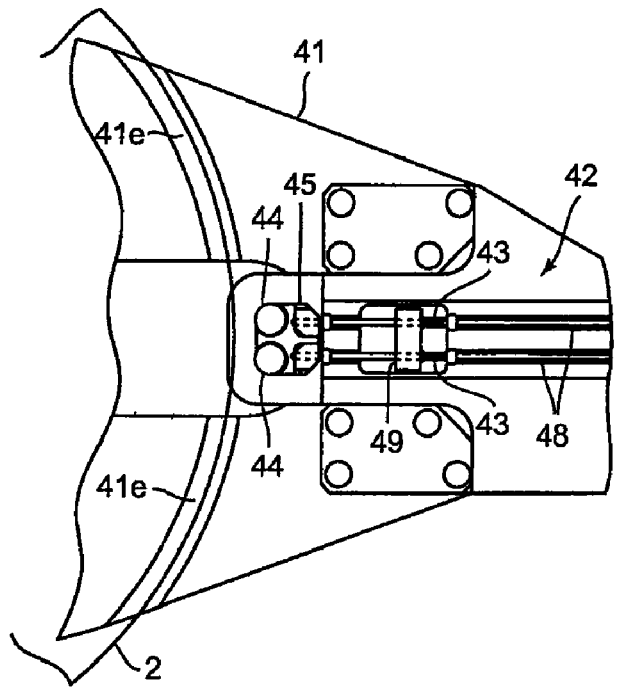
FIGS. 13(A) and 13(B) are plan views for explaining an operation of the first holding part shown in FIGS. 6(A) and 6(B).
Figure 13B:
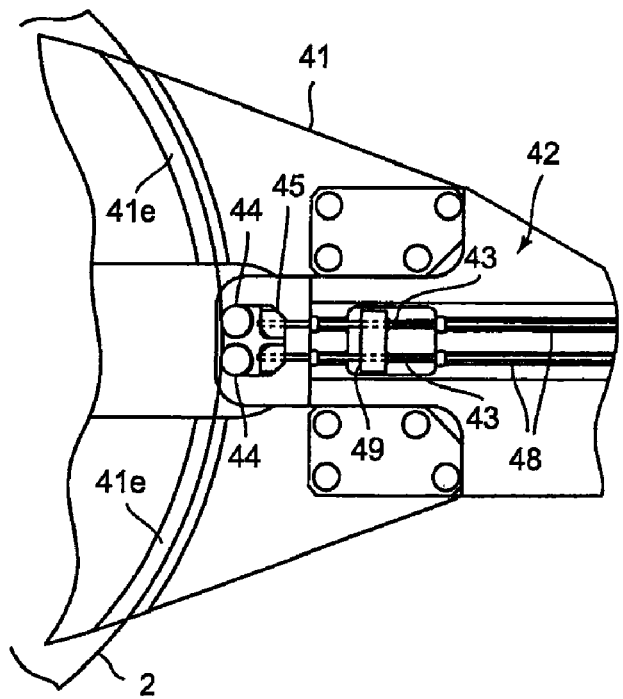

FIG. 11 is a cross-sectional view showing a connecting portion of the first hand 3 and the second hand 4 with the second arm 7 shown in FIG. 1. FIG. 12 is a cross-sectional view showing a positional relationship between a first cam member 83 and a second cam member 84 and the rollers 46, 56, 66 and 76 shown in FIG. 11. FIGS. 13(A) and 13(B) are plan views for explaining an operation of the first holding part 42 shown in FIGS. 6(A) and 6(B). FIG. 13(A) is a view showing a state where the first holding part 42 is retreated from a wafer 2 and FIG. 13(B) is a view showing a state where the first holding part 42 abuts with and holds the wafer 2.

As described above, the pulley 31 is fixed to the bottom face at the substantially center portion of the second hand 4, and the pulley 32 is fixed to the bottom face at the substantially center portion of the first hand 3. Specifically, as shown in FIG. 11, the pulley 31 is fixed to a periphery of the through-hole 60$b$ of the base member 60, and the pulley 32 is fixed to a periphery of the through-hole 40$a$ of the base member 40.

Further, as described above, the pulleys 31 and 32 are turnably supported by the fixed shaft 30. Specifically, as shown in FIG. 11, the pulley 32 is turnably supported by the fixed shaft 30 through a bearing 80. Further, the pulley 31 is disposed on the outer peripheral side of the pulley 32 and is turnably supported by the fixed shaft 30 through a bearing 81 disposed between the pulley 31 and the pulley 32, the pulley 32 and the bearing 80.

As shown in FIGS. 11 and 12, the second arm 7 is provided with a first cam member 83, which is formed in a roughly ring shape and formed with a cam face 83$a$ with which the rollers 46 and 56 are abutted on its inner peripheral face, and a second cam member 84 which is formed in a roughly ring shape and formed with a cam face 84$a$ with which the rollers 66 and 76 are abutted on its inner peripheral face. As shown in FIG. 12, the inner peripheral face of the second cam member 84 is formed larger than an outer diameter of the first cam member 83. In this embodiment, when the first cam member 83 and the second cam member 84 are described collectively, they are described as "cam members 83 and 84". In the embodiment described above, since the rollers 46, 56 and the like are urged in the outer side direction and thus the first cam face 83$a$ is formed on the inner peripheral face of the cam member 83. However, when the rollers 46, 56 and the like are urged in the center direction of the fixed shaft 30, the first cam face 83$a$ is formed on the outer peripheral face of the cam member 83.

The first cam member 83 is fixed to an upper end of the fixed shaft 30 through a predetermined holding member. Specifically, the first cam member 83 is fixed to the upper end of the fixed shaft 30 so that the shaft center of the fixed shaft 30 (turning center "C") is substantially coincided with the center in a radial direction of the first cam member 83. Therefore, when the articulated arm part 5 performs an extending and folding operation, the first cam member 83 is relatively turned with respect to the first hand 3 with the turning center "C" as the center. Accordingly, the cam face 83$a$ which is formed on the inner peripheral face of the first cam member 83 is formed as follows: With a turning operation of the first hand 3 with respect to the second arm 7 in accordance with an extending and folding operation of the articulated arm part 5, before a conveying object is conveyed, the cam face 83$a$ is formed so that the first holding part 42 is positioned in a retreated state from the conveying object and, when the articulated arm part 5 performs an extending and folding operation for conveying the conveying object, the cam face 83$a$ is formed so that the first holding part 42 is moved in a holding direction of the conveying object by means of that the first hand 3 is turned with respect to the second arm 7. In this embodiment, the first cam member 83 is disposed on the inner peripheral side of the upper end part of the pulley 32. Further, the first cam member 83 and the upper end portion of the pulley 32 are disposed on the inner peripheral side of the through-hole 60$b$.

As shown in FIG. 12, the cam face 83$a$ which is formed on the inner peripheral face of the first cam member 83 is formed in a point symmetrical manner with the turning center "C" of the first hand 3 and the second hand 4 as the center. Specifically, the cam face 83$a$ includes a small diameter curved face part 83$b$, a first flat face part 83$c$, which is formed to be connected with one end of the small diameter curved face part 83$b$ (lower end in FIG. 12) and inclined toward an outer side in the radial direction, a large diameter curved face part 83$d$, which is formed to be connected with the first flat face part 83$c$ and is provided with a radius of curvature larger than the small diameter curved face part 83$b$, and a second flat face part 83$e$, which is formed to be connected with one end of the large diameter curved face part 83$d$ (right-side end in FIG. 12) and inclined toward an inner side in the radial direction. Further, the cam face 83$a$ also includes a small diameter curved face part 83$f$ a first flat face part 83$g$, a large diameter curved face part 83$h$ and a second flat face part 83$j$ which are respectively disposed in a point symmetrical manner with respect to the small diameter curved face part 83$b$, the first flat face part 83$c$, the large diameter curved face part 83$d$ and the second flat face part 83$e$ with the turning center "C" as the center.

As shown in FIG. 12, the roller 46 structuring the first holding part 42 is abutted with the small diameter curved face part 83$b$, the first flat face part 83$c$ and the large diameter curved face part 83$d$. In other words, in this embodiment, the first cam face 83$k$ with which the first holding part 42 is abutted is structured of the small diameter curved face part 83$b$, the first flat face part 83$c$ and the large diameter curved face part 83$d$. Further, the roller 56 structuring the second holding part 52 is abutted with the small diameter curved face part 83$f$ the first flat face part 83$g$ and the large diameter curved face part 83$h$. In this embodiment, the second cam face 83$m$ with which the second holding part 52 is abutted is structured of the small diameter curved face part 83$f$, the first flat face part 83$g$ and the large diameter curved face part 83$h$.

The second cam member 84 is fixed to an outer peripheral portion on the tip end side of the second arm 7 in a state that the second cam member 84 is held by a predetermined holding member which forms an outer side face of the second arm 7. Specifically, the second cam member 84 is fixed to the tip end side of the second arm 7 so that the shaft center of the fixed shaft 30 (turning center "C") is substantially coincided with the center in the radial direction of the second cam member 84. Therefore, when the articulated arm part 5 performs an extending and folding operation, the second cam member 84 is relatively turned with respect to the second hand 4 with the turning center "C" as the center.

Similarly to the first cam member 83, when the rollers 66, 76 and the like are urged in the center direction of the fixed shaft 30, the second cam face 84a of the second cam member 84 is formed on an outer peripheral face of the cam member 84. Similarly to the first cam member 83, when the rollers 66, 76 and the like are urged in the center direction of the fixed shaft 30, the second cam face 84a of the second cam member 84 is formed on an outer peripheral face of the cam member 84.

As shown in FIG. 12, the cam face 84a which is formed on the inner peripheral face of the second cam member 84 is formed in a point symmetrical manner with the turning center "C" as the center. Specifically, the cam face 84a includes a small diameter curved face part 84b, a first flat face part 84c, which is formed to be connected with one end of the small diameter curved face part 84b (lower end in FIG. 12) and inclined toward an outer side in the dial direction, a large diameter curved face part 84d, which is formed to be connected with the first flat face part 84c and is provided with a radius of curvature larger than the small diameter curved face part 84b, and a second flat face part 84e, which is formed to be connected with one end of the large diameter curved face part 84d (right-side end in FIG. 12) and inclined toward an inner side in the radial direction. Further, the cam face 84a also includes a small diameter curved face part 84f, a first flat face part 84g, a large diameter curved face part 84h and a second flat face part 84j which are respectively disposed in a point symmetrical manner with respect to the small diameter curved face part 84b, the first flat face part 84c, the large diameter curved face part 84d and the second flat face part 84e with the turning center "C" as the center.

As shown in FIG. 12, the roller 66 structuring the first holding part 62 is arranged to abut with the small diameter curved face part 84b, the first flat face part 84c and the large diameter curved face part 84d. In other words, in this embodiment, the first cam face 84k with which the first holding part 62 is abutted is structured of the small diameter curved face part 84b, the first flat face part 84c and the large diameter curved face part 84d. Further, the roller 76 structuring the second holding part 72 is arranged to abut with the small diameter curved face part 84f, the first flat face part 84g and the large diameter curved face part 84h. In other words, in this embodiment, the second cam face 84m with which the second holding part 72 is abutted is structured of the small diameter curved face part 84f, the first flat face part 84g and the large diameter curved face part 84h.

In this embodiment, in the state where the first hand 3 and the second hand 4 are closed as shown in FIG. 2(A), the first holding part 42 is retreated from a wafer 2 in the state that the articulated arm part 5 has been extended (before conveying out the wafer 2 from the transfer chamber 10 or the process chamber 11). In other words, in this state, as shown in FIG. 13(A), the rollers 44 are separated from the wafer 2. Similarly, in this state, the first holding part 62 and the second holding parts 52 and 72 are retreated from a wafer 2.

Further, in this embodiment, in the state where the first hand 3 and the second hand 4 are opened as shown in FIG. 3(A), the first holding part 42 is retreated from a wafer 2 in the state that the articulated arm part 5 has been extended. Similarly, in this state, the first holding part 62 and the second holding parts 52 and 72 are retreated from a wafer 2. In other words, in this embodiment, an opening/closing operation of the first hand 3 and the second hand 4 can be performed in the state where the first holding parts 42 and 62 and the second holding parts 52 and 72 have been retreated (when the first holding parts 42 and 62 and the second holding parts 52 and 72 are described collectively, they are described as "holding parts 42, etc.").

Specifically, the rollers 46, 56, 66 and 76 are disposed at positions shown by the thick solid lines in FIG. 12 in the state where the first hand 3 and the second hand 4 have been closed as shown in FIG. 2(A), and the rollers 46, 56, 66 and 76 are respectively abutted with vicinities of the center positions of the small diameter curved face parts 83b, 83f, 84b and 84f. Further, when the first hand 3 and the second hand 4 have been opened as shown in FIG. 3(A), the rollers 46, 56, 66 and 76 are disposed at positions as shown by the dotted lines in FIG. 12 and the rollers 46, 56, 66 and 76 are respectively abutted with end parts of the small diameter curved face parts 83b, 83f, 84b and 84f.

As described above, in the state where the articulated arm part 5 has been extended, since the rollers 46, 56, 66 and 76 are abutted with the small diameter curved face parts 83b, 83f, 84b and 84f, the holding parts 42, etc. are pulled toward the turning center "C" against urging forces of the compression coil springs 43 to be retreated from wafers 2.

On the other hand, as shown in FIG. 2(B), in the state where the articulated arm part 5 has been folded (before beginning to convey a wafer 2 into the transfer chamber 10 or the process chamber 11), the first holding part 42 is abutted with a wafer 2 to hold the wafer 2. In other words, in this state, the rollers 44 are abutted with the wafer 2 to hold the wafer 2 as shown in FIG. 13(B). Similarly, in this state, the first holding part 62 and the second holding parts 52 and 72 are abutted with the wafer 2 to hold the wafer 2.

Further, in this embodiment, as shown in FIG. 3(B), even when the articulated arm part 5 has been folded, the holding parts 42, etc. are abutted with wafers 2 and the wafers 2 are held. In other words, in this embodiment, an opening/closing operation of the first hand 3 and the second hand 4 can be performed in the state where the wafers 2 are held by the holding parts 42, etc.

Specifically, in the state where the first hand 3 and the second hand 4 have been closed as shown in FIG. 2(B), the rollers 46, 56, 66 and 76 are disposed at positions shown by the thin solid lines in FIG. 12 and the rollers 46, 56, 66 and 76 are respectively abutted with one end parts of the large diameter curved face parts 83d, 83h, 84d and 84h. Further, in the state where the first hand 3 and the second hand 4 have been opened as shown in FIG. 3(B), the rollers 46, 56, 66 and 76 are disposed at positions shown by the two-dot chain lines in FIG. 12, and the rollers 46, 56, 66 and 76 are respectively abutted with the other end parts of the large diameter curved face parts 83d, 83h, 84d and 84h.

As described above, in the state that the articulated arm part 5 has been folded, since the rollers 46, 56, 66 and 76 are abutted with the large diameter curved face parts 83d, 83h, 84d and 84h, the holding parts 42, etc. are abutted with wafers 2 with the urging forces of the compression coil springs 43 to hold the wafers 2.

In this embodiment, when wafers 2 are held by the holding parts 42, etc., the wafer 2 is also abutted with the vertical faces 41b of the placing member 41. In other words, the wafer 2 is held by the holding parts 42, etc. and the vertical faces 41b. In this embodiment, as shown in FIGS. 3(A) and 3(B), a wafer 2 is held by the holding parts 42, etc. and the vertical faces 41b which are disposed with a roughly 120° interval.

In order to convey out a wafer 2 from the transfer chamber 10 or the process chamber 11, when the articulated arm part 5 is folded from the extended state, the rollers 46, 56, 66 and 76 are moved from the positions shown by the thick solid lines in FIG. 12 to the positions shown by the thin solid lines, or moved from the positions shown by the dotted lines in FIG. 12 to the positions shown by the two-dot chain lines. In other words, the cam members 83 and 84 are relatively turned with respect to the hands 3 and 4 together with an operation of the articulated arm part 5 when the wafers 2 are to be conveyed out so that the holding parts 42, etc. are moved in the direction for holding wafers 2. In this embodiment, when the articulated arm part 5 is folded from the extended state, the rollers 46, 56, 66 and 76 are moved in a counterclockwise direction from the positions shown by the thick solid lines in FIG. 12 to the positions shown by the thin solid lines and, alteratively, from the positions shown by the dotted lines in FIG. 12 to the positions shown by the two-dot chain lines.

On the other hand, in order to convey a wafer 2 into the transfer chamber 10 or the process chamber 11, when the articulated arm part 5 is extended from the folded state, the rollers 46, 56, 66 and 76 are moved from the positions shown by the thin solid lines in FIG. 12 to the positions shown by the thick solid lines and, alternatively, from the positions shown by the two-dot chain lines in FIG. 12 to the positions shown by the dotted lines. In other words, the cam members 83 and 84 are relatively turned with respect to the hands 3 and 4 so that the holding parts 42, etc. are moved from wafers 2 in a retreating direction with an extending operation of the articulated arm part 5 at the time of conveying of wafers 2. In this embodiment, when the articulated arm part 5 is extended from the folded state, the rollers 46, 56, 66 and 76 are moved in the clockwise direction from the positions shown by the thin solid lines in FIG. 12 to the positions shown by the thick solid lines and, alternatively, from the positions shown by the two-dot chain lines in FIG. 12 to the positions shown by the dotted lines.

As described above, in this embodiment, the cam faces 83*a* and 84*a* are formed in a point symmetrical manner with the turning center "C" as the center, and the first cam faces 83*k* and 84*k* and the second cam faces 83*k* and 84*m* are disposed in a point symmetrical manner with the turning center "C" as the center. Therefore, in this embodiment, in order to perform appropriate holding operations and retreating operations by the holding parts 42, etc., the cam members 83 and 84 are relatively turned by a predetermined range of angle with respect to the hands 3 and 4 so that the rollers 46, 56, 66 and 76 are moved between the positions shown by the thick solid lines in FIG. 12 and the positions shown by the thin solid lines and, alternatively, between the positions shown by the dotted lines in FIG. 12 and the positions shown by the two-dot chain lines. In this case, the articulated arm part 5 is extended and folded toward one direction with respect to the main body part 6.

At the time of accelerating operation of the articulated arm part 5 when a wafer 2 is conveyed out, a relative inertia force toward the tip end side of the hands 3 and 4 is occurred to the wafer 2. Further, also at the time of decelerating operation of the articulated arm part 5 when the wafer 2 is conveyed in, a relative inertia force toward the tip end side of the hands 3 and 4 is occurred to the wafer 2. In these circumstances and, when the holding parts 42, etc. do not hold wafers 2, positional displacements of wafers 2 are restricted by the vertical faces 41*a* of the placing members 41 which are abutted with the wafers 2.

As described above, in this embodiment, the cam faces 83*a* and 84*a* are formed on the inner peripheral faces of the cam members 83 and 84, which are relatively turned with respect to the hands 3 and 4 around the turning center "C" of the hands 3 and 4 to the second arm 7, for retreating the holding parts 42, etc. from wafers 2 before conveying out of the wafers 2 and for moving the holding parts 42, etc. in the holding direction of the wafers 2 with operation of the articulated arm part 5 when wafers 2 are conveyed out. Therefore, even when wafers 2 are held in a mechanical structure, the size in the radial direction of the connecting portion of the second arm 7 with the hands 3 and 4 can be reduced. As a result, in this embodiment, the size of the robot 1 can be reduced.

Especially, in this embodiment, the cam faces 83*a* and 84*a* are provided with the first cam faces 83*k* and 84*k*, with which the first holding parts 42 and 62 are abutted and the second cam faces 83*m* and 84*m* with which the second holding parts 52 and 72 are abutted. Therefore, even when the hands 3 and 4 are provided with the first holding parts 42 and 62 and the second holding parts 52 and 72 for holding wafers 2 at respective both end sides of the hands 3 and 4, the size in the radial direction of the connecting portion of the second arm 7 with the hands 3 and 4 can be reduced. Further, the first holding parts 42 and 62 and the second holding parts 52 and 72 can be separately operated by the first cam faces 83*k* and 84*k* and the second cam faces 83*m* and 84*m*.

Further, in this embodiment, the turning center of the first hand 3 and the turning center of the second hand 4, which are relatively turnable to each other, are set to be the same turning center "C". Therefore, even in a robot 1 provided with the first hand 3 and the second hand 4, the size in the radial direction of the connecting portion of the second arm 7 with the hands 3 and 4 can be reduced. Further, since wafers 2 can be conveyed in and out by using two hands 3 and 4, working hours for conveying wafers 2 into and out can be shortened. Further, in this embodiment, since the second arm 7 is provided with the first cam member 83 and the second cam member 84, the first holding part 42 and the second holding part 52 of the first hand 3 and the first holding part 62 and the second holding part 72 of the second hand 4 can be separately operated by the first cam member 83 and the second cam member 84.

In this embodiment, the holding parts 42, etc. are provided with the rotatable rollers 46, 56, 66 and 76 which are abutted with the cam faces 83*a* and 84*a*. Therefore, contact resistances between the cam faces 83*a* and 84*a* and the holding parts 42, etc. when the cam members 83 and 84 are relatively turned with respect to the hands 3 and 4, can be reduced.

In this embodiment, the holding parts 42, etc. are disposed on the base end side of the placing member 41 and the abutting parts 41*a* with which the end part of a wafer 2 is abutted are formed on the tip end side of the placing member 41. Therefore, at the beginning of extending and folding operation of the articulated arm part 5 when a wafer 2 is to be conveyed out, even when the holding parts 42, etc. do not hold the wafer 2, the end part of the wafer 2 is abutted with the abutting part 41*a* at the beginning of the extending and folding operation and thus positional displacement of the wafer 2 can be restricted. Further, even when the holding parts 42, etc. do not hold the wafer 2 before the end of the extending and folding operation of the articulated arm part 5 when the wafer 2 is conveyed in, the end part of the wafer 2 is abutted with the abutting part 41*a* before the end of the extending and folding operation and thus positional displacement of the wafer 2 can be restricted.

In this embodiment, the holding parts 42, etc. are provided with rotatable rollers 44 which can be abutted with a wafer 2. Therefore, even when a wafer 2 has occurred positional displacement on the placing member 41 at the time when the holding parts 42, etc. are to be abutted with the wafer 2, the wafer 2 can be positioned at a predetermined position by operations of the rollers 44 without being damaged.

In this embodiment, the holding parts 42, etc. are linearly moved in a holding direction or a retreating direction of a wafer 2. Therefore, in comparison with a case where a lever mechanism described in the above-mentioned Patent Reference is used, arrangement space for the holding parts 42, etc. can be reduced and thus the hands 3 and 4 can be made smaller and thinner. Further, in this embodiment, the holding parts 42, etc. are provided with two shaft members 48 or 68 which are linearly guided by the slide bearings 50. Therefore, turning of the holding parts 42, etc. around the shaft center in the moving direction of the holding parts 42, etc. can be prevented by the two shaft members 48 or 68.

The present invention has been described in detail by using the embodiments, but the present invention is not limited to the embodiments described above and many modifications can be made without departing from the present invention.

In the embodiment described above, the first cam faces 83*k* and 84*k* and the second cam faces 83*k* and 84*m* are disposed in a point symmetrical manner with the turning center "C" as the center. Further, in order to perform appropriate holding and retreating operations by using the holding parts 42, etc., the articulated arm part 5 is extended and folded in one direction with respect to the main body part 6. However, for example, the cam faces 83*a* and 84*a* may be formed in a shape so that the holding parts 42, etc. perform appropriate holding and retreating operation even when the articulated arm part 5 is extended and folded in both directions with respect to the main body part 6. In this case, while performing appropriate holding and retreating operation by using the holding parts 42, etc., for example, the articulated arm part 5 can be extended and folded in both the right and left directions in FIGS. 2(A) and 2(B) and FIGS. 3(A) and 3(B) and thus working hours for conveying in and out of a wafer 2 by the robot 1 can be shortened.

In the embodiment described above, the cam faces 83*a* and 84*a* are formed so that the holding parts 42, etc. are retreated from wafers 2 in the state where the articulated arm part 5 has been extended and the holding parts 42, etc. hold the wafers 2 in the state where the articulated arm part 5 has been folded. However, the present invention is not limited to this embodiment. For example, the cam faces 83*a* and 84*a* may be formed so that the holding parts 42, etc. hold wafers 2 in the middle of extending and folding operation of the articulated arm 7 and the holding parts 42, etc. are retreated from the wafers 2 in the state where the articulated arm part 5 has been extended or folded.

In the embodiment described above, the holding parts 42, etc. are provided with two shaft members 48 and 68. Alternatively, for example, the holding parts 42, etc. may be provided with three or more shaft members 48 and 68. Further, the holding parts 42, etc. may be provided with only one shaft member 48 and 68. In this case, a holding member formed in a "V" shape is, for example, fixed to the tip end sides of the shaft members 48 and 68 instead of the holding member 45. When only one shaft member 48 and only one shaft member 68 are used, the shaft members 48 and 68 are preferably formed not in a cylindrical shape but in a multi-angular columnar shape to prevent the shaft members 48 and 68 from turning.

In the embodiment described above, the second arm 7 is provided with the first cam member 83 and the second cam member 84. However, the present invention is not limited to this embodiment. For example, the second arm 7 may be provided with one cam member on which a cam face with which all of the rollers 46, 56, 66 and 76 are abutted is formed.

In the embodiment described above, the robot 1 is provided with two hands, i.e., the first hand 3 and the second hand 4. However, the robot 1 may be provided with either of the first hand 3 or the second hand 4. Further, in the embodiment described above, the hands 3 and 4 are provided with the first mounting parts 38 and 58 and the second mounting parts 39 and 59 on both end sides of the hands 3 and 4. However, the hands 3 and 4 may be provided with either of the first mounting parts 38 and 58 or the second mounting parts 39 and 59. In this case, the cam faces 83*a* and 84*a* may be provided with either of the first cam faces 83*k* and 84*k* or the second cam faces 83*m* and 84*m*.

In the embodiment described above, the robot 1 is a so-called cylinderical type robot in which the hands 3 and 4 are radially moved in the state where they are directed in a fixed direction when the articulated arm part 5 is extended and folded. However, the robot to which the present invention is applied is not limited to a cylindrical type robot. In other words, the present invention may be applied to a robot in which directions of the hands 3 and 4 are changed with extending and folding of the articulated arm part. Further, in the embodiment described above, the articulated arm part 5 is structured of two arms, i.e., the second arm 7 and the first arm 8. However, the articulated arm part 5 may be structured of three or more arms.

In the embodiment described above, an urging member for urging the holding parts 42, etc. in the direction for holding a wafer 2 is a compression coil spring 43. However, the present invention is not limited to this embodiment. For, example, a spring member such as a helical extension spring or a plate spring or an elastic member such as rubber may be utilized as the urging member for urging the holding parts 42, etc. Further, in the embodiment described above, the substantially center portions of the hands 3 and 4 are turnably connected with the tip end side of the second arm 7. However, arbitrary portions of the hands 3 and 4 may be turnably connected with the tip end side of the second arm 7. Further, in the embodiment described above, the holding parts 42, etc. are provided with the rollers 46, 56, 66 and 76 which are abutted with the cam faces 83*a* and 84*a*. However, the present invention is not limited to this embodiment. For example, the holding parts 42, etc. may be provided with protruded parts abutting with the cam faces 83*a* and 84*a* instead of the rollers 46, 56, 66 and 76.

In the embodiment described above, the robot 1 is a so-called vacuum robot used in a vacuum state but the robot 1 may be used in the atmosphere. In other words, the robot to which the present invention is applied is not limited to a vacuum robot. Further, in the embodiment described above, an conveying object which is conveyed by the robot 1 is a disk-shaped wafer 2. However, a conveying object which is conveyed by the robot 1 may be a board formed in a disk shape except the wafer 2 or may be a board formed in a polygonal shape such as a rectangular shape.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for conveying a conveying object comprising:
    a hand for mounting the conveying object which comprises a first and second mounting part, each mounting part comprising:
        a holding part which is capable of abutting with the conveying object to hold the conveying object; and
        an urging member which urges the holding part;

an articulated arm part which comprises at least two arms including a hand holding arm that turnably holds the hand on a tip end side of the hand holding arm and which is extended and folded when the conveying object is conveyed;

a main body part which turnably holds the articulated arm part; and a cam member which is provided in the hand holding arm and which is formed with a cam face with which the holding part is abutted and which is relatively turned with respect to the hand around a turning center of the hand with respect to the hand holding arm with an extending and folding operation of the articulated arm part;

wherein the cam face is formed so that the holding part is retreated from the conveying object before the conveying object is conveyed and, with the extending and folding operation of the articulated arm part when the conveying object is conveyed, the holding part is moved in a holding direction to hold the conveying object;

the hand comprises an elongated member with the first holding part at a first end and the second holding part at a second end; and the cam face comprises a first cam face with which the first holding part is abutted and a second cam face with which the second holding part is abutted.

2. The industrial robot according to claim 1, wherein the hand comprises a first hand and a second hand which are capable of being relatively turned to each other and which are disposed in an overlapped manner so that the first hand and the second hand have respectively the same turning centers to the hand holding arm.

3. The industrial robot according to claim 2, wherein the hand holding arm is provided, as the cam member, a first cam member with which the first and second holding parts of the first hand are abutted and a second cam member with which the first and second holding parts of the second hand are abutted.

4. The industrial robot according to claim 1, wherein
the each mounting part is provided with a placing member on which the conveying object is to be placed, and
the each holding part is disposed on a base end side of the placing member which is a turning center side of the hand.

5. The industrial robot according to claim 4, wherein each holding part is provided with a cam face abutting part which abuts with its cam face on the turning center side of the hand.

6. The industrial robot according to claim 5, wherein each cam face abutting part is a turnable cam face abutting roller which is abutted with its cam face.

7. The industrial robot according to claim 6, wherein each holding part is provided with a turnable conveying object abutting roller which is abutted with its conveying object.

8. The industrial robot according to claim 4, wherein each holding part is provided with a conveying object abutting part which is abutted with its conveying object on the base end side of its placing member.

9. The industrial robot according to claim 4, wherein each placing member is provided on a tip end side with an abutting part with which an end part of the conveying object is capable of abutting.

10. The industrial robot according to claim 4, wherein each holding part is linearly moved in the holding direction of its conveying object and in a retreated direction from the conveying object.

11. The industrial robot according to claim 10, wherein each holding part is provided with at least two shaft members which are linearly guided in the holding direction and in the retreated direction.

12. The industrial robot according to claim 10, wherein
the cam face of the cam member is formed with the turning center of the hand with respect to the hand holding arm as a center, and
each holding part is provided with a cam face abutting part which is abutted with the cam face.

13. The industrial robot according to claim 12, wherein
the cam face is formed so that, with a turning operation of the hand with respect to the hand holding arm in accordance with the extending and folding operation of the articulated arm part, before the conveying object is conveyed, each holding part is positioned in a retreated state from the conveying object and, when the articulated arm part performs the extending and folding operation for conveying the conveying object, each holding part is moved in the holding direction of the conveying object by means of which the hand is turned with respect to the hand holding arm.

* * * * *